US008418089B2

(12) United States Patent
Higuchi et al.

(10) Patent No.: US 8,418,089 B2
(45) Date of Patent: Apr. 9, 2013

(54) COMPUTER READABLE NON-TRANSITORY MEDIUM STORING DESIGN AIDING PROGRAM, DESIGN AIDING APPARATUS, AND DESIGN AIDING METHOD FOR DETERMINING PERFORMANCE INDEX OF AN INTEGRATED CIRCUIT IN WORST CASE OPERATION CONDITIONS

(75) Inventors: Hiroyuki Higuchi, Kawasaki (JP); Hidetoshi Matsuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/210,945

(22) Filed: Aug. 16, 2011

(65) Prior Publication Data

US 2012/0117526 A1 May 10, 2012

(30) Foreign Application Priority Data

Nov. 9, 2010 (JP) ................. 2010-251180

(51) Int. Cl.
*G06F 17/50* (2006.01)

(52) U.S. Cl.
USPC ............. 716/56; 716/108; 716/111; 716/112; 716/113; 716/132; 716/133; 716/134; 716/136; 714/704; 714/705; 702/127; 702/128; 702/129; 702/179; 702/182

(58) Field of Classification Search .............. 716/56, 716/108, 111–113, 132–134, 136; 714/704–705; 702/127–129, 179–182
See application file for complete search history.

(56) References Cited

U.S. PATENT DOCUMENTS

| 7,493,574 B2 * | 2/2009 | Liu et al. ................. 716/132 |
| 7,669,150 B2 * | 2/2010 | Li et al. .................. 716/132 |
| 7,716,023 B2 * | 5/2010 | Barker et al. ................ 703/2 |
| 2010/0076741 A1 * | 3/2010 | Takeuchi ................... 703/14 |

FOREIGN PATENT DOCUMENTS

| JP | 11-296561 A | 10/1999 |
| WO | WO-2008/102681 | 8/2008 |

OTHER PUBLICATIONS

Cijan et al., A Direct search method for worst case analysis and yield optimization of integrated circuits, 2009, Word Scientific Publishing Company, vol. 18, No. 7, pp. 1185-1204.*
Tsukamoto, Yasumasa et al., "Worst-Case Analysis to Obtain Stable Read/Write DC Margin of High Density 6T-SRAM-Array with Local Vth Variability", 2005 IEEE, May 31, 2005; pp. 398-405.

* cited by examiner

*Primary Examiner* — Nghia Doan
(74) *Attorney, Agent, or Firm* — Fujitsu Patent Center

(57) ABSTRACT

A computer readable non-transitory medium storing a design aiding program causes a computer to execute a process of determining worst-case corner candidates for each of a plurality of condition sets. The design aiding program causes the computer to execute a process of mapping the worst-case corner candidates that are within an allowable range. The design aiding program causes a computer to execute a process of determining the worst-case corner candidates that minimize the number of the worst-case corner candidates mapped to the condition sets by handling the worst-case corner candidates thus mapped as a single worst-case corner candidate to be worst-case corners.

18 Claims, 14 Drawing Sheets

|      | WC1 | WC2 | WC3 | WC4 |
|------|-----|-----|-----|-----|
| PTV1 | 1   |     |     |     |
| PTV2 |     |     |     |     |
| PTV3 |     |     |     |     |
| PTV4 |     |     |     |     |

13b

|  | WC1 | WC2 | WC3 | WC4 |
|---|---|---|---|---|
| PTV1 | 1 |  |  |  |
| PTV2 | 0 | 1 |  |  |
| PTV3 |  |  |  |  |
| PTV4 |  |  |  |  |

| | WC1 | WC2 | WC3 | WC4 |
|---|---|---|---|---|
| PTV1 | 1 | | | |
| PTV2 | 0 | 1 | | |
| PTV3 | 1 | | 1 | |
| PTV4 | 0 | | | 1 |

FIG.11

|  | WC1 | WC2 | WC3 | WC4 |
|---|---|---|---|---|
| PTV1 | 1 | 0 | 1 | 0 |
| PTV2 | 0 | 1 | 0 | 0 |
| PTV3 | 1 | 0 | 1 | 1 |
| PTV4 | 0 | 0 | 1 | 1 |

FIG.12A

|      | WC1 | WC2 | WC3 | WC4 |
|------|-----|-----|-----|-----|
| PTV1 | 1   | 0   | 1   | 0   |
| PTV2 | 0   | 1   | 0   | 0   |
| PTV3 | 1   | 0   | 1   | 1   |
| PTV4 | 0   | 0   | 1   | 1   |

FIG.12B

|      | WC2 | WC3 | WC4 |
|------|-----|-----|-----|
| PTV2 | 1   | 0   | 0   |
| PTV4 | 0   | 1   | 1   |

FIG.12C

|      | WC3 | WC4 |
|------|-----|-----|
| PTV4 | 1   | 1   |

FIG.12D

|      | WC2 | WC3 | WC4 |
|------|-----|-----|-----|
| PTV1 | 0   | 1   | 0   |
| PTV2 | 1   | 0   | 0   |
| PTV3 | 0   | 1   | 1   |
| PTV4 | 0   | 1   | 1   |

FIG.12E

|      | WC3 | WC4 |
|------|-----|-----|
| PTV1 | 1   | 0   |
| PTV3 | 1   | 1   |
| PTV4 | 1   | 1   |

COMPUTER READABLE NON-TRANSITORY MEDIUM STORING DESIGN AIDING PROGRAM, DESIGN AIDING APPARATUS, AND DESIGN AIDING METHOD FOR DETERMINING PERFORMANCE INDEX OF AN INTEGRATED CIRCUIT IN WORST CASE OPERATION CONDITIONS

CROSS-REFERENCE TO RELATED APPLICATION

This application is based upon and claims the benefit of priority of the prior Japanese Patent Application No. 2010-251180, filed on Nov. 9, 2010, the entire contents of which are incorporated herein by reference.

FIELD

The embodiments discussed herein are directed to a design aiding program, a design aiding apparatus, and a design aiding method.

BACKGROUND

Conventionally known is a circuit design aiding technology that uses a simulation to judge whether conforming circuits such as static random access memories (SRAMs) are produced at a predetermined chip yield rate.

For example, as one of such technologies, a technology using a worst-case corner is known. In one example using a worst-case corner, parameters in a model function for calculating a circuit performance index are handled as random variables. In other words, in this example, variations in the parameters are taken into account upon performing a simulation. In this example, in a performance index space plotted by these parameters, a point where the performance index takes the maximum value or the minimum value is searched across an equal probability plane corresponding to a predetermined chip yield rate, and the point thus searched is used as a worst-case corner. The parameters at the worst-case corner are then used to judge whether the circuit operates normally in this example.

In such an example, the worst-case corner is determined depending on various conditions such as process conditions P, and a temperature T and a voltage V that are external conditions (hereinafter, abbreviated as PTV conditions). Therefore, when plural sets of different conditions, e.g., PTV conditions, are specified, a worst-case corner is determined for each set of the PTV conditions, and the parameters corresponding to each of the worst-case corners are used in judging whether the circuit operates normally. In such a conventional technology, if the circuit operates normally under all of these condition sets, an examiner considers that conforming circuits can be produced at a predetermined chip yield rate. Related-art examples are described in Japanese Laid-open Patent Publication No. 11-296561, International Publication Pamphlet No. WO 2008/102681, and Y. Tsukamoto et al., "Worst-Case Analysis to Obtain Stable Read/Write DC Margin of High Density 6T-SRAM-Array with Local Vth Variability", ICCAD 2005, 398-405, 2005.

However, in the conventional technology, because the number of worst-case corners determined increases as the number of condition sets to be simulated increases, the management of the worst-case corners becomes cumbersome.

SUMMARY

According to an aspect of an embodiment of the invention, a computer readable non-transitory medium storing a design aiding program for causing a computer to execute mapping worst-case corner candidates that are within an allowable range by determining, for each one of a plurality of condition sets, worst-case corner candidates on an equal probability plane representing a chip yield rate within a space of performance indices plotted by parameters that are random variables of a model function for calculating a performance index of an object being designed based on the condition sets, object-being-designed information representing the object being designed, and the chip yield rate; and determining the worst-case corner candidates that minimize number of worst-case corner candidates mapped to the condition sets by handling the worst-case corner candidates thus mapped as a single worst-case corner candidate to be worst-case corners used in simulating an operation of the object being designed under the condition sets.

According to another aspect of an embodiment of the invention, a design aiding apparatus includes a first determining unit that maps worst-case corner candidates that are within an allowable range by determining worst-case corner candidates for each one of a plurality of condition sets on an equal probability plane representing a chip yield rate within a space of performance indices plotted by parameters that are random variables of a model function for calculating a performance index of an object being designed based on the condition sets, object-being-designed information representing the object being designed, and the chip yield rate; and a second determining unit that determines the worst-case corner candidates that minimize number of worst-case corner candidates mapped to the condition sets by handling the worst-case corner candidates mapped by the first determining unit as a single worst-case corner candidate to be worst-case corners used in simulating an operation of the object being designed under the condition sets.

According to still another aspect of an embodiment of the invention, a design aiding method executed by a computer, the method includes mapping worst-case corner candidates that are within an allowable range by determining worst-case corner candidates for each one of a plurality of condition sets on an equal probability plane representing a chip yield rate within a space of performance indices plotted by parameters that are random variables of a model function for calculating a performance index of an object being designed based on the condition sets, object-being-designed information representing the object being designed, and the chip yield rate; and determining the worst-case corner candidates that minimize number of worst-case corner candidates mapped to the condition sets by handling the worst-case corner candidates thus mapped as a single worst-case corner candidate to be worst-case corners used in simulating an operation of the object being designed under the condition sets.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 11 is another schematic for explaining the exemplary process of determining worst-case corner candidates;

FIG. 12A is a schematic for explaining an exemplary process of determining worst-case corners;

FIG. 12B is another schematic for explaining the exemplary process of determining worst-case corners;

FIG. 12C is another schematic for explaining the exemplary process of determining worst-case corners;

FIG. 12D is another schematic for explaining the exemplary process of determining worst-case corners;

FIG. 12E is another schematic for explaining the exemplary process of determining worst-case corners;

DESCRIPTION OF EMBODIMENTS

Preferred embodiments of the present invention will be explained with reference to accompanying drawings.

However, these embodiments are not intended to limit the scope of the technologies disclosed herein in any way.

[a]First Embodiment

Structure of Design Aiding Apparatus

Figure 1:
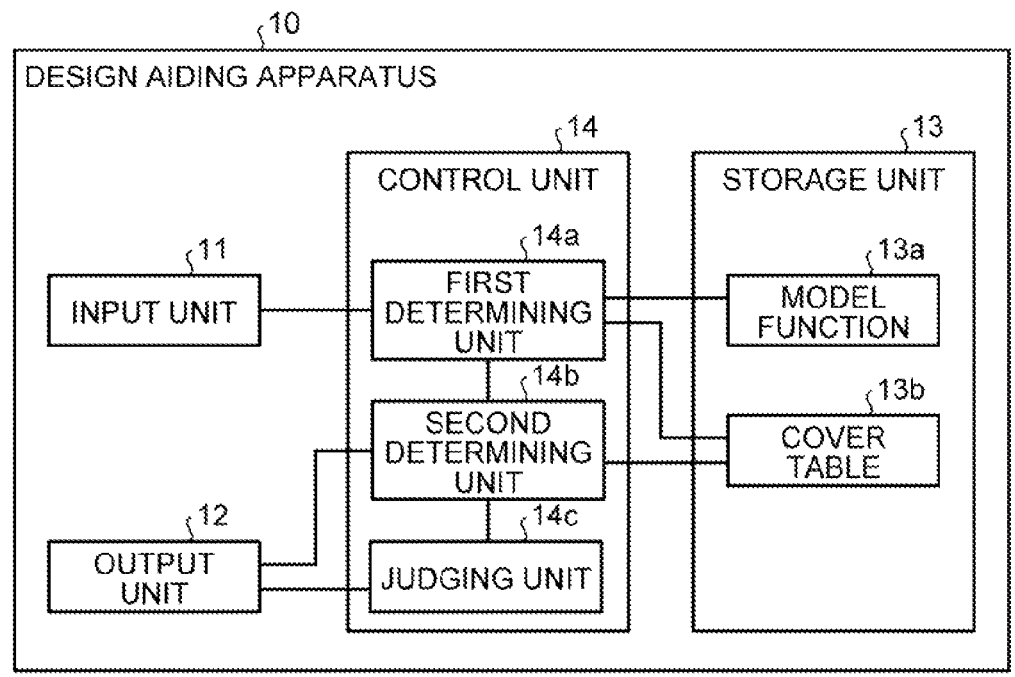
FIG. 1 is a schematic of a design aiding apparatus according to a first embodiment of the present invention.

FIG. 1 is a schematic of a design aiding apparatus according to a first embodiment of the present invention. This design aiding apparatus 10 according to the first embodiment determines a worst-case corner candidate for each one of a plurality of condition sets. The design aiding apparatus 10 according to the first embodiment then handles a plurality of worst-case corner candidates within a predetermined allowable range of a margin, which is a performance index, as a single worst-case corner candidate. The design aiding apparatus 10 according to the first embodiment then determines worst-case corner candidates that minimize the number of the worst-case corner candidates mapped to each of the condition sets to be the worst-case corners.

As illustrated in FIG. 1, the design aiding apparatus 10 includes an input unit 11, an output unit 12, a storage unit 13, and a control unit 14.

The input unit 11 inputs various types of information to the control unit 14. For example, the input unit 11 receives an instruction from a user, and inputs the received instruction to the control unit 14. The input unit 11 also receives a user operation to input circuit information representing an SRAM circuit structure for which worst-case corners are to be selected by a simulation and whose designing is to be aided to the control unit 14. The input unit 11 also receives a user operation to input a plurality of PTV condition sets used in a simulation for determining worst-case corners to the control unit 14. The input unit 11 also receives a user operation to input the capacity of the SRAM circuit to the control unit 14. The input unit 11 also receives a user operation to input a wafer yield rate of the SRAM circuits to the control unit 14. The input unit 11 also receives a user operation to input an allowable margin such as an angle or a chip yield rate corresponding to a predetermined scale of a performance index to the control unit 14. The input unit 11 may be an operation receiving device such as a mouse or a keyboard.

Figure 2:
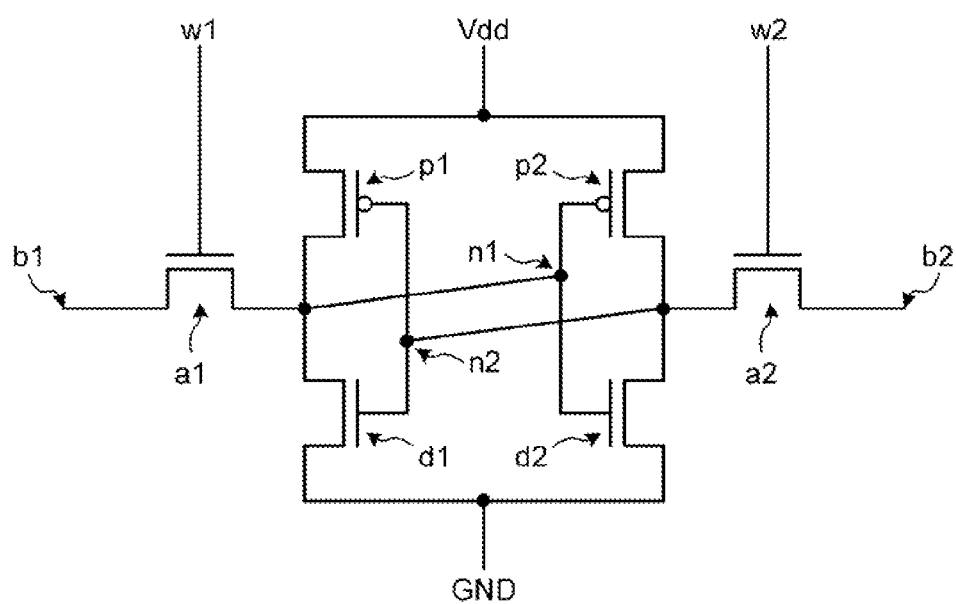
FIG. 2 is an exemplary circuit diagram of a memory cell included in an SRAM circuit.

FIG. 2 is an exemplary circuit diagram of a memory cell included in an SRAM circuit. In the example illustrated in FIG. 2, the memory cell has driver transistors d1 and d2, access transistors a1 and a2, and load transistors p1 and p2 that are six transistors in total. As to the types of these transistors, the driver transistors d1 and d2 and the access transistors a1 and a2 are n-channel metal-oxide-semiconductor field-effect transistors (MOSFETs), for example, and the load transistors p1 and p2 are p-channel MOSFETs, for example.

The gate w1 of the access transistor a1 and the gate w2 of the access transistor a2 are connected to a common word line. One terminal b1 of the access transistor a1 is connected to a first bit line. One terminal b2 of the access transistor a2 is connected to a second bit line. The memory cell is connected to a power source Vdd and a ground GND. The potential of the ground GND is at zero. When one of internal nodes n1 and n2 in the memory cell is at the power source potential, the other is at the ground potential. Information of either "1" or "0" is stored in the memory cell depending on which one of the internal nodes n1 and n2 is at the power source potential.

The output unit 12 outputs various types of information. For example, the output unit 12 displays parameters in a worst-case corner determined by a second determining unit 14b, which is to be described later, on a display device. The output unit 12 also displays a judgment result of a judging unit 14c, which is to be described later, on the display device. An exemplary device for the output unit 12 is a display device such as a liquid crystal display (LCD) or a cathode ray tube (CRT).

The storage unit 13 stores therein various types of information. For example, the storage unit 13 stores therein a model function 13a for calculating a performance index of the SRAM circuit. For example, the storage unit 13 stores therein a model function 13a for calculating a time spent by the SRAM circuit to write data, or an allowable range of noise that will not cause a value "0" or "1" to change even if such noise is introduced to the voltage applied to the SRAM circuit, as a performance index of the SRAM circuit. As exemplary parameters of the model function 13a, three parameters, a length L, a width W, and a threshold voltage Vth, can be considered for each of the six transistors included in the SRAM circuit. In this example, the number of the parameters for the SRAM circuit is eighteen (3×6).

Let us consider now how to determine the worst case in which the speed for writing information to the memory cell becomes the lowest assuming that characteristics of each of the transistors included in the SRAM circuit vary randomly, that is, in an uncorrelated manner.

Figure 3:
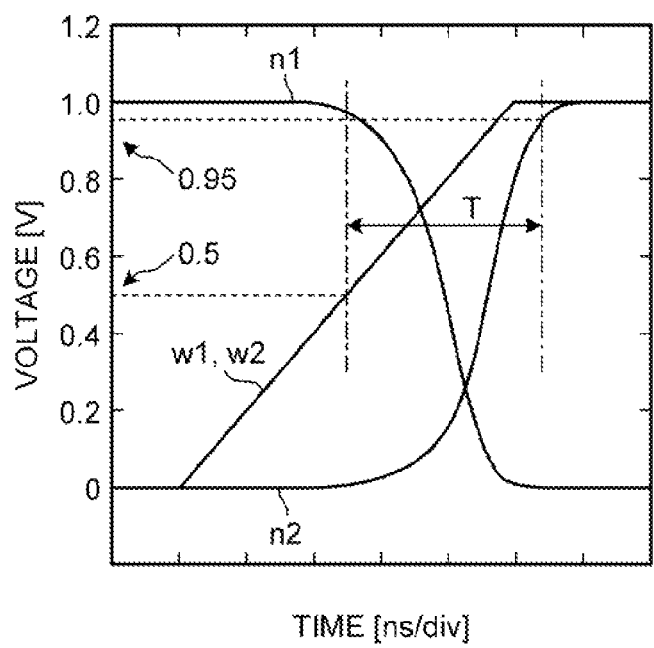
FIG. 3 is a schematic for explaining an example of a performance index of the exemplary SRAM circuit illustrated in FIG. 2.

FIG. 3 is a schematic for explaining an example of the performance index of the exemplary SRAM circuit illustrated in FIG. 2. It is assumed here that the internal node n1 is initially at the power source potential, and the internal node n2 is initially at the zero potential. This condition is defined as "a condition for writing 1". To invert this condition so as to write "0", as the first step, the potential of the terminal b1 is reduced to the zero potential, and the potential of the terminal b2 is raised to the power source potential. The word line potential, that is the potential at the gates w1 and w2, is then raised from the zero potential to the power source potential so as to bring the access transistors a1 and a2 in the conductive state. In this manner, the potential of the internal node n1 is reduced to zero, and the potential of the internal node n2 are raised to the power source potential. Time T that is time spent for writing can be defined using these operations. For example, as illustrated in FIG. 3, the time T can be defined as time from when the word line potential is raised to a half of the power source voltage until when the potential of the internal node n2 reaches 95 percent of the power source voltage. According to the first embodiment, this time T illustrated in the example in FIG. 3 may be used as the performance index.

Characteristics of each of the transistors included in the SRAM circuit in the example illustrated in FIG. 2 are modeled as a transistor model used in a circuit simulation. A circuit simulation model represents, for example, a current-to-voltage characteristic or a capacity-to-voltage characteristic of a device, such as a transistor, in a simple mathematical expression, and is usually referred to as a compact model. A typical example of a compact model is Berkeley Short-Channel IGFET Model (BSIM). A model function used in a compact model contains adjustable parameters. A model function is also referred to a model formula. The values of the parameters are adjusted so that the model function can achieve characteristics that match the characteristics of an actual device. This adjusting operation is referred to as parameter extraction. A calculation of the waveforms such as those illustrated in FIG. 3 is possible by performing a circuit simulation using such a compact model. As a result, the performance index T can be calculated. In other words, in this example, these parameters of the model function plot a space of the performance indices T.

The compact model according to the first embodiment is used in modeling variations of characteristics of an individual device or variations of characteristics of a circuit including a device having such varying characteristics.

To model varying phenomena observed in circuit characteristics of an SRAM circuit having the six transistors illustrated in FIG. 2 and resulting from varying characteristics of these transistors, the following approach can be thought of. To begin with, one of the parameters included in a compact model for these transistors is considered to be a random variable to define variation of such a parameter. For example, each of the parameters, namely, the threshold voltage Vth, the length L, and the width W of each of the transistors is considered to be a random variable. It is also assumed that characteristics of each of the six transistors included in the SRAM circuit vary independently. Therefore, the threshold voltage Vth, the length L, and the width W of each of the transistors can be changed independently. Thus, each of the threshold voltage Vth, the length L, and the width W of each of the transistors d1, d2, a1, a2, p1, and p2 is considered to be an independent random variable. It is also assumed that these eighteen random variables are distributed in an uncorrelated manner based on a normal distribution with a predetermined median and a predetermined standard deviation. Such a predetermined standard deviation is set appropriately so that device characteristics calculated using the compact model reproduce variations in the actual device characteristics. For example, the standard deviations of the threshold voltage Vth, the length L, and the width W are set to values that are equal to the respective standard deviations of thresholds that are actually measured in the transistors.

As described above, by using one of the parameters in a compact model as a random variable and defining the distribution of the parameter, the variation of the performance index can be modeled. The reason behind it is as follows. Because a performance index can be calculated by a circuit simulation, the performance index can be represented as a function of parameters in a compact model. Once the variation of a parameter being considered as a random variable is defined, the variation of the performance index can also be defined via such a function.

The storage unit 13 stores therein a cover table 13b. The cover table 13b is a table to be registered with a mapping relationship between plurality of condition sets being input and a worst-case corner candidate mapped thereto. A first determining unit 14a, to be explained later, registers information representing the mapping relationship between PTV condition sets and worst-case corner candidates. The cover table 13b will be explained later.

The storage unit 13 is, for example, a semiconductor memory element such as a flash memory, or a storage device such as a hard disk or an optical disk. The storage unit 13 is not limited to these types of storage devices, and may also be a random access memory (RAM) or a read-only memory (ROM).

The control unit 14 has an internal memory for storing therein computer programs specifying various procedures and control data, and executes various processes using the computer programs and the control data. The control unit 14 includes the first determining unit 14a, the second determining unit 14b, and the judging unit 14c, as illustrated in FIG. 1.

The first determining unit 14a determines worst-case corner candidates. An exemplary method for determining worst-case corner candidates performed by the first determining unit 14a will now be explained. The first determining unit 14a calculates a chip yield rate X from a capacity D [megabits] and a wafer yield rate Y of the SRAM circuit entered via the input unit 11 based on the equation (1) below, for example.

$$X^D = Y \quad (1)$$

For example, when the capacity D is 1 megabit (1047586 bits) and the wafer yield rate Y is 0.99 (99 percent), X is obtained from "$X^{1047586}=0.99$" as $X=0.99^{1/1047586}=0.99999999999064$. This chip yield rate X may be input to the control unit 14 by the examiner via the input unit 11.

The first determining unit 14a then determines a distance r from predetermined design values used in determining a worst-case corner candidate from the chip yield rate X. The distance r is calculated from the following equation (2).

$$\Phi(r) = \int_{-\infty}^{r} \frac{1}{\sqrt{2\pi}} \exp\left(-\frac{t^2}{2}\right) dt \quad (2)$$

where the value $\Phi(r)$ represents the chip yield rate X.

For example, when the chip yield rate X is 0.99999999999064 as mentioned above, r=5.62 is obtained from the above equation (2).

At this time, points on a hypersphere at the distance r from the predetermined design values represent the points where combinations of the parameters yielding the SRAM circuits at the chip yield rate X occur at an equal probability. Therefore, such a hypersphere is sometimes referred to as an equal probability plane. The chip yield rate is the same at any point on the hypersphere. Therefore, by using the parameters corresponding to the worst-case corner exhibiting the worst performance index from these points on the hypersphere upon performing a simulation for checking for the normal operations of the SRAM circuits, it is possible to judge whether conforming SRAM circuits can be produced at the chip yield rate X. An exemplary case where the performance index takes the worst value is a case where the SRAM spends the longest time to perform writing. Another example is a case where the allowable range of noise that can be introduced to the voltage applied to the SRAM circuit without changing the value "0" or "1" maintained thereby becomes the narrowest.

Figure 4:
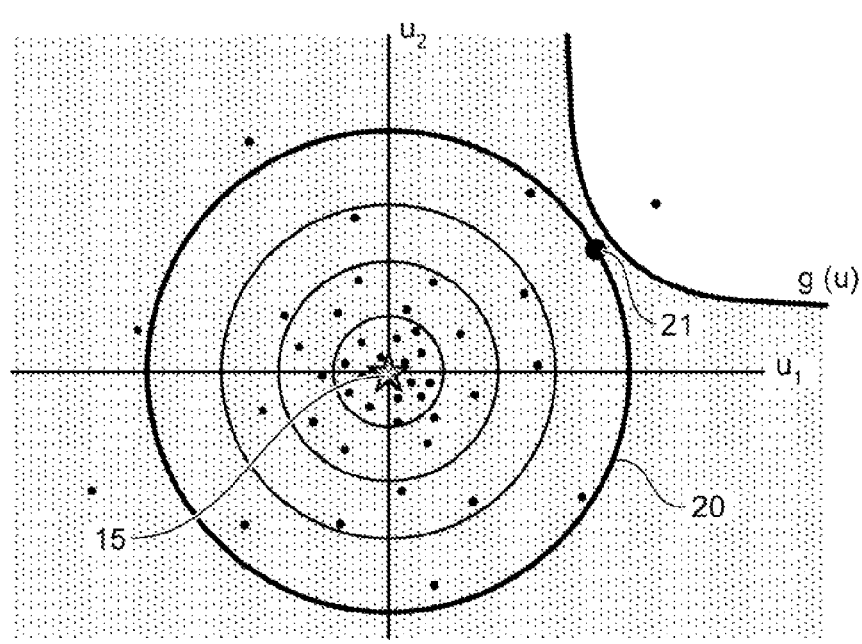
FIG. 4 is a schematic for explaining an exemplary process of determining worst-case corner candidates.

FIGS. 4 to 11 are schematics for explaining an exemplary process of determining worst-case corner candidates. As mentioned earlier, the model function 13a according to the embodiment has eighteen parameters. However, for the convenience of explanation, the process of determining worst-case corner candidates will be explained with reference to FIGS. 4 to 11 under an assumption that the model function has two parameters. In the example illustrated in FIG. 4, the horizontal axis represents the amount of deviation from a design value for a parameter $u_1$ in the SRAM circuit, and the vertical axis represents the amount of deviation from a design value for a parameter $u_2$ in the SRAM circuit. The intersection 15 between the horizontal axis and the vertical axis represents the deign values of the parameters $u_1$ and $u_2$. The parameter $u_1$ or $u_2$ represents the threshold voltage and the like in a transistor. An axis, not illustrated, perpendicular to the vertical axis and the horizontal axis illustrated in FIG. 4 represents the performance index of the SRAM circuits. The performance index takes a value that is dependent on PTV conditions. Therefore, when a set of PTV conditions differs, the performance index corresponding thereto may be different even for the parameters whose amount of deviation from the design values of the SRAM circuit is the same. The performance index is also referred to as a margin.

The first determining unit 14a determines a worst-case corner candidate for each of the PTV condition sets. Upon determining a first worst-case corner candidate, the first determining unit 14a determines a worst-case corner candidate under one of the PTV condition sets based on a predetermined gradient method using a point on the performance index corresponding to predetermined design values for the parameters as a point of origin. To use a specific example, the first determining unit 14a calculates a gradient of the performance index at the point on the performance index corresponding to the predetermined design values, and calculates a gradient exhibiting the worst performance index. The first determining unit 14a then determines the intersection between the gradient thus calculated and the hypersphere as a worst-case corner candidate. In this manner, the first determining unit 14a determines the first worst-case corner candidate. The first determining unit 14a then registers information for mapping the worst-case corner candidate thus determined to the corresponding PTV condition set to the cover table 13b.

For the other PTV condition sets, the first determining unit 14a determines corresponding worst-case corner candidates based on a predetermined gradient method, using the worst-case corner candidate thus having been determined as a point of origin. The reason why the worst-case corner candidates for the other PTV condition sets are determined using the already-determined worst-case corner candidate is as explained below. It can be assumed that, even if the PTV condition sets differ, the position of the worst-case corner candidates would be nearly the same and located close to each other. Therefore, a process can be simplified by determining the worst-case corner candidates for the other PTV condition sets using the already-determined worst-case corner candidate as a point of origin, compared with when the worst-case corner candidates are determined based on the gradient method using a point on the performance index corresponding to the design values as a point of origin.

A specific example will be explained with reference to FIGS. 4 to 11. In the explanation below, it is assumed that PTV1 to PTV4 are input as a plurality of PTV condition sets. For example, as process conditions specified in PTV1, the process variation of the n-channel MOSFETs in the SRAM circuit is set to Slow ($3\sigma$), and the process variation of the p-channel MOSFETs is set to Slow ($3\sigma$). As external conditions specified in PTV1, the temperature is set to zero degree Celsius, and the voltage is set to 1 volt. As process conditions specified in PTV2, the process variation of the n-channel MOSFETs in the SRAM circuit is set to Slow ($3\sigma$), and the process variation of the p-channel MOSFETs is set to Slow ($3\sigma$). As external conditions specified in PTV2, the temperature is set to 100 degrees Celsius, and the voltage is set to 1 volt. As process conditions specified in PTV3, for example, the process variation of the n-channel MOSFETs in the SRAM circuit is set to Slow ($3\sigma$), and the process variation of the p-channel MOSFETs is set to Slow ($3\sigma$). As external conditions specified in PTV3, the temperature is set to zero degree Celsius, and the voltage is set to 1.4 volts. As process conditions specified in PTV4, for example, the process variation of the n-channel MOSFETs in the SRAM circuit is set to Slow ($3\sigma$), and the process variation of the p-channel MOSFETs is set to Slow ($3\sigma$). As external conditions specified in PTV4, the temperature is set to 100 degrees Celsius, and the voltage is set to 1.4 volts.

For example, to begin with, the first determining unit 14a selects one of the PTV condition sets, e.g., PTV1, from PTV1 to PTV4, which are a plurality of PTV condition sets. The first determining unit 14a then uses a predetermined gradient method using the point in the performance index where the deviation for the parameters $u_1$ and $u_2$ is zero as a point of origin to determine the point taking the worst performance index on a hypersphere 20 as a worst-case corner candidate 21 under the selected PTV condition set. For example, assuming that the time spent by the SRAM circuit to perform writing is used as the performance index, the first determining unit 14a determines a point on the hypersphere 20 where the SRAM circuit spends the longest time to perform writing to be the worst-case corner candidate 21. When the allowable range of noise is used as the performance index, the first determining unit 14a determines the point on the hypersphere 20 where the allowable range of the noise becomes the narrowest to be the worst-case corner candidate 21. In the example illustrated in FIG. 4, because the number of parameters is explained to be two for the convenience of explanation, the hypersphere 20 is represented as a circle.

Figures 5, 6:
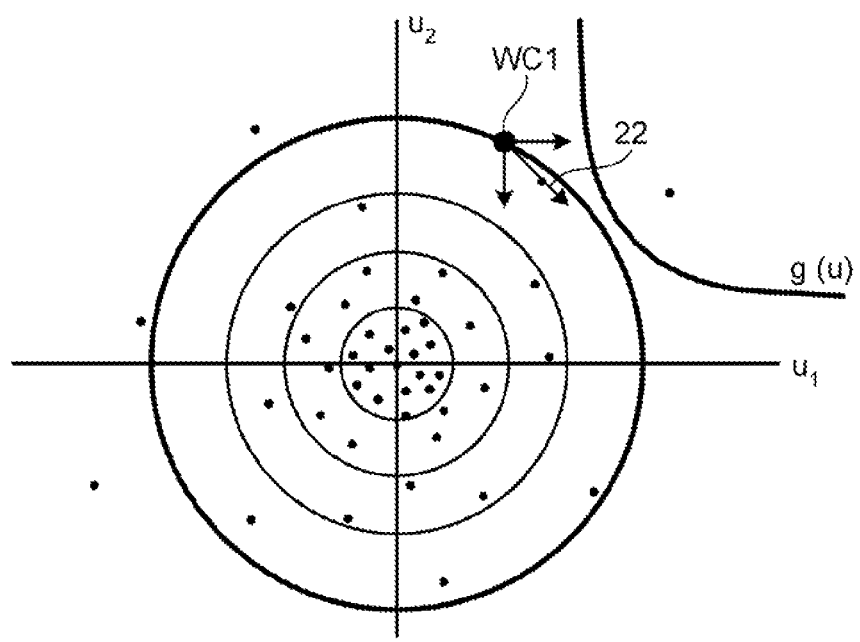
FIG. 5 is another schematic for explaining the exemplary process of determining worst-case corner candidates.
FIG. 6 is another schematic for explaining the exemplary process of determining worst-case corner candidates.

When PTV1 is selected from PTV1 to PTV4 and WC1 is determined to be the worst-case corner candidate corresponding to PVT1, the first determining unit 14a performs the process below. That is, the first determining unit 14a registers information, e.g., 1, indicating that PTV1 and WC1 are in a mapping relationship to the cover table 13b, as illustrated in FIG. 5.

The cover table 13b is a table for registering a mapping relationship between a plurality of input condition sets and worst-case corner candidates. For example, when the number of input condition sets is N, the cover table 13b is configured to be able to be registered with mapping relationships between N sets of conditions and N worst-case corner candidates. When the number of condition sets to be input is known in advance, the cover table 13b enabled to be registered with every mapping relationship determined by the number is stored in the storage unit 13. When the number of condition sets to be input is not known in advance, the first determining unit 14a may be caused to generate the cover table 13b depending on the number of condition sets, and to store the cover table 13b in the storage unit 13.

Figures 7, 8:
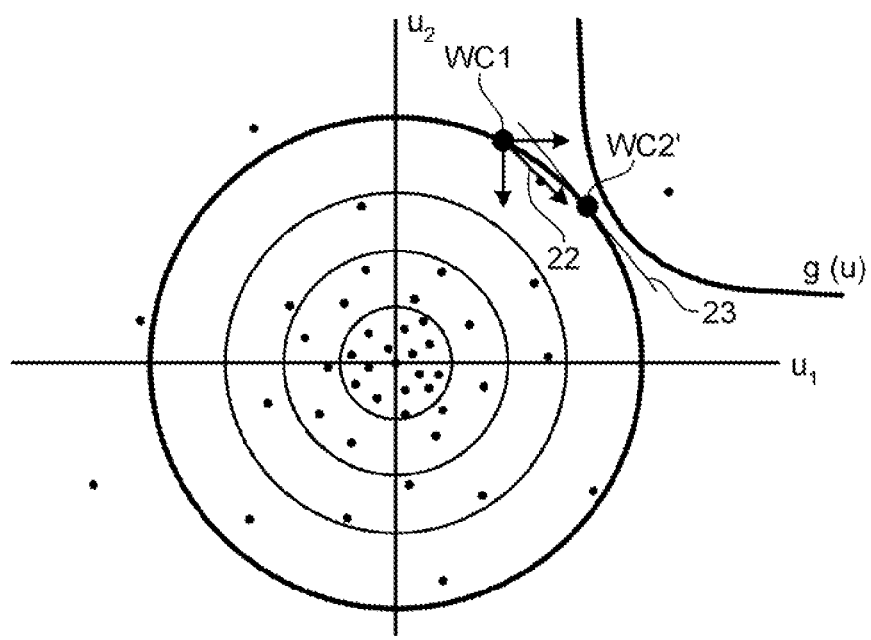
FIG. 7 is another schematic for explaining the exemplary process of determining worst-case corner candidates.
FIG. 8 is another schematic for explaining the exemplary process of determining worst-case corner candidates.

The first determining unit 14a then selects a condition set not selected yet from PTV1 to PTV4. For example, the first determining unit 14a selects PTV2. The first determining unit 14a calculates performance index gradients at the already-determined worst-case corner candidate WC1 under the conditions specified in the PTV2 as illustrated in FIG. 6, and obtains a gradient 22 taking the worst performance index. The first determining unit 14a then determines the tangent point WC2' where a line 23 in parallel with the direction represented by the gradient 22 is in tangent with the hypersphere 20 as a worst-case corner candidate WC2, as illustrated in FIG. 7. The first determining unit 14a then registers information indicating that WC2 and PTV2 are in a mapping relationship, e.g., "1", to the cover table 13b.

The first determining unit 14a then determines whether the worst-case corner candidate WC2 is within the allowable margin from WC1. When the worst-case corner candidate WC2 is within the allowable margin from WC1, the first determining unit 14a handles the worst-case corner candidates WC1 and WC2 as a single worst-case corner. At this time, the first determining unit 14a registers the information indicating that WC1 and PTV2 are in a mapping relationship, e.g., "1", to the cover table 13b.

Figures 9, 10:
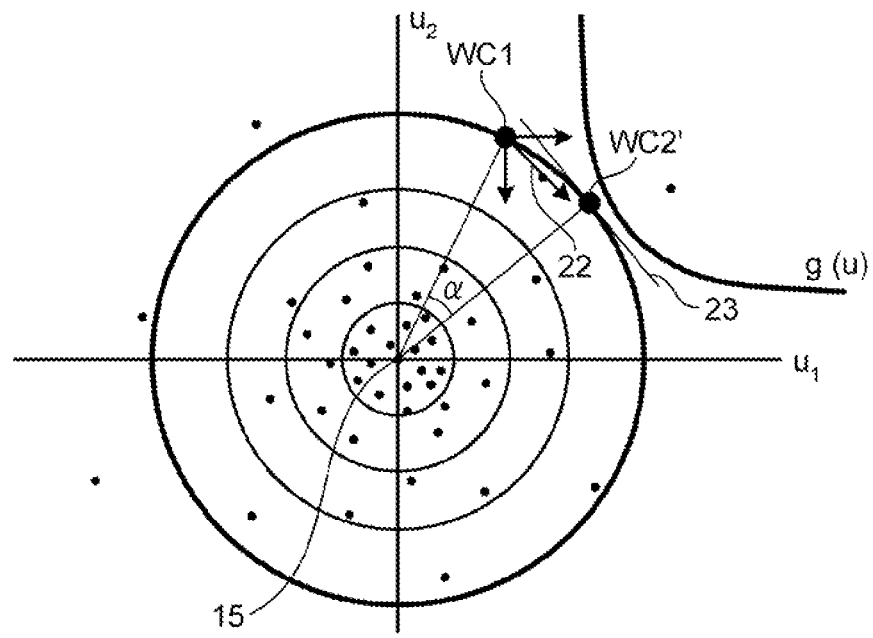
FIG. 9 is another schematic for explaining the exemplary process of determining worst-case corner candidates.
FIG. 10 is another schematic for explaining the exemplary process of determining worst-case corner candidates.

To explain the allowable margin using a specific example, when an angle $\alpha_{ref}$ is entered as an allowable margin as illustrated in FIG. 9, the first determining unit 14a determines whether the angle $\alpha$ formed between WC1 and WC2' centering on the design values 15 is within the angle $\alpha_{ref}$. When the angle $\alpha$ is larger than the angle $\alpha_{ref}$, the first determining unit 14a determines that WC1 and WC2' are not within the allowable margin. When the angle $\alpha$ is equal to or smaller than the angle $\alpha_{ref}$, the first determining unit 14a determines that WC1 and WC2' are within the allowable margin.

On the contrary, if the worst-case corner candidate WC2 is not within the allowable margin from WC1, the first determining unit 14a stores information, e.g., "0", indicating that WC1 is not in a mapping relationship with PTV2 to the cover table 13b, as illustrated in FIG. 8.

The first determining unit 14a then performs the same process applied to WC1 under the conditions specified in PTV2 to WC1 under the conditions of each of PTV3 and PTV4. The example illustrated in FIG. 10 indicates that the first determining unit 14a has established a mapping relationship between WC1 and PTV3 because a worst-case corner candidate WC3 determined under the conditions of PTV3 is found to be within the allowable margin from WC1. The example illustrated in FIG. 10 also indicates that the first determining unit 14a has not established a mapping relationship between WC1 and PTV4 because a worst-case corner candidate WC4 determined under the conditions of PTV4 is not within the allowable margin from WC1. The example illustrated in FIG. 10 also indicates that PTV3 is mapped to WC3 because the first determining unit 14a has determined the worst-case corner candidate WC3. The example illustrated in FIG. 10 also indicates that PTV4 is mapped to WC4 because the first determining unit 14a has determined the worst-case corner candidate WC4.

After applying such a process to WC1 under each of the condition sets PTV1 to PTV4, the first determining unit 14a determines whether each of WC1, WC3, and WC4 is within the allowable margin from WC2, and registers the information indicating the mapping relationship to the cover table 13b in the same manner. The first determining unit 14a also determines whether each of WC1, WC2, and WC4 is within the allowable margin from WC3, and registers the information indicating the mapping relationship to the cover table 13b. The first determining unit 14a also determines whether each of WC1, WC2, and WC3 is within the allowable margin from WC4, and registers the information indicating mapping relationship to the cover table 13b. The first determining unit 14a can omit determination for a combination of worst-case corner candidates having already been determined whether such worst-case corner candidates are within the allowable margin. In this manner, the process can be further simplified.

FIG. 11 is an example of the cover table registered with the information indicating the mapping relationships. The example of the column for WC1 in FIG. 11 indicates that WC3 determined under the condition set PTV3 is within the allowable margin from WC1. In other words, the example of the column for WC1 in FIG. 11 indicates that WC1 and WC3 can be handled as the same worst-case corner candidate. Furthermore, the example of the column for WC3 in FIG. 11 indicates that WC1 determined under the condition set PTV1 is within the allowable margin from WC3. Furthermore, the example of the column for WC3 in FIG. 11 indicates that WC4 determined under the condition set PTV4 is within the allowable margin from WC3. In other words, the example of the column for WC3 in FIG. 11 indicates that WC3, WC1, and WC4 can be handled as the same worst-case corner candidate. Furthermore, the example of the column for WC4 in FIG. 11 indicates that WC3 determined under the condition set PTV3 is within the allowable margin from WC4. In other words, the example of the column for WC4 in FIG. 11 indicates that WC4 and WC3 can be handled as the same worst-case corner candidate.

Referring back to FIG. 1, the second determining unit 14b determines the worst-case corner candidates that minimize the number of the worst-case corner candidates mapped to the condition sets by handling the worst-case corner candidates that can be handled as the same worst-case corner candidate as a single worst-case corner candidate. The second determining unit 14b then determines the worst-case corner candidates thus determined to be the worst-case corners used in simulating the operation of a designed object under the condition sets.

For example, when the information "1" is mapped to each one of the condition sets registered to the cover table 13b, the second determining unit 14b uses the branch-and-bound method to determine the worst-case corner candidates that minimize the number of the worst-case corner candidates to be the worst-case corners. The second determining unit 14b then outputs the worst-case corners thus determined from the output unit 12.

FIGS. 12A to 12E are schematics for explaining an exemplary process of determining the worst-case corners. FIG. 12A is a schematic of an example of the cover table 13b. The same content registered to the cover table 13b illustrated in FIG. 11 is registered to the exemplary cover table 13b illustrated in FIG. 12A. To begin with, the second determining unit 14b selects WC1 from the content registered to the cover table 13b illustrated in FIG. 12A. In the example illustrated in FIG. 12A, WC1 is mapped to PTV1 and PTV3. Therefore, the remaining condition sets to be mapped with worst-case corner candidates are PTV2 and PTV4.

FIG. 12B is a schematic of the remaining condition sets after WC1 is selected in the example illustrated in FIG. 12A. The column for WC2 in FIG. 12B indicates that WC2 is mapped to PTV2; the column for WC3 in FIG. 12B indicates that WC3 is mapped to PTV4; and the column for WC4 in FIG. 12B indicates that WC4 is mapped to PTV4.

In the example illustrated in FIG. 12B, the second determining unit 14b selects WC2. Because WC2 is mapped to PTV2 in the example illustrated in FIG. 12B, the remaining condition set to be mapped with a worst-case corner candidate is PTV4.

FIG. 12C is a schematic of the remaining condition set when WC2 is selected in the example illustrated in FIG. 12B. The column WC3 in FIG. 12C indicates that WC3 is mapped to PTV4; and the column for WC4 in FIG. 12C indicates that WC4 is mapped to PTV4.

In the example of FIG. 12C, the second determining unit 14b selects WC3. In the example illustrated in FIG. 12C, WC3 is mapped to PTV4. Therefore, there is no longer any remaining condition set to be mapped with a worst-case corner candidate. In this situation, the condition sets correspond to three worst-case corner candidates {WC1, WC2, WC3} as a cover solution.

On the contrary, let us consider a case in which the second determining unit 14b selects WC4 instead of WC3 in the example illustrated in FIG. 12C. Under such an assumption, WC4 corresponds to PTV4 in the example illustrated in FIG. 12C, and the number of the worst-case corner candidates to be the cover solution would be three: {WC1, WC2, WC4}. In this situation, the number of the worst-case corner candidates is not smaller than that when the three worst-case corner candidates {WC1, WC2, WC3} are selected as the cover solution. Therefore, so-called "pruning" is performed.

Let us now assume that, in the example illustrated in FIG. 12A, the second determining unit 14b does not select WC1 from the content registered to the cover table 13b illustrated in FIG. 12A. In this situation, the second determining unit 14b deletes the column for WC1 from the cover table 13b illustrated in FIG. 12A.

FIG. 12D is a schematic of the remaining condition sets when the column for WC1 is deleted from the example illustrated in FIG. 12A. The column for WC2 in FIG. 12D indicates that WC2 is mapped to PTV2; the column for WC3 in FIG. 12D indicates WC3 is mapped to PTV1, PTV3, and PTV4; and the column for WC4 in FIG. 12D indicates that WC4 is mapped to PTV3 and PTV4.

In the example illustrated in FIG. 12D, the second determining unit 14b selects WC2. In the example illustrated in FIG. 12D, WC2 is mapped to PTV2. Therefore, the remaining condition sets to be mapped with a worst-case corner candidate are PTV1, PTV3, and PTV4.

FIG. 12E is a schematic of the remaining condition sets when WC2 is selected in the example illustrated in FIG. 12D. The column for WC3 in FIG. 12E indicates that WC3 is mapped to PTV1, PTV3 and PTV4; and the column for WC4 in FIG. 12E indicates that WC4 is mapped to PTV3 and PTV4.

In the example illustrated in FIG. 12E, the second determining unit 14b selects WC3. In the example illustrated in FIG. 12E, WC3 is mapped to PTV1, PTV3, and PTV4. Therefore, there is no longer any remaining condition set to be mapped with a worst-case corner candidate. In this situation, the condition sets correspond to two worst-case corner candidates {WC2, WC3} as a cover solution.

On the contrary, let us consider a situation in which the second determining unit 14b selects WC4 instead of WC3 in the example illustrated in FIG. 12E. In this case, because WC4 is mapped to PTV3 and PTV4 in the example illustrated in FIG. 12E, the remaining condition set to be mapped with a worst-case corner candidate is PTV1. Therefore, the number of the worst-case corner candidates being the cover solution is not smaller than two, namely, {WC2, WC3} mentioned above. Therefore, the so-called "pruning" is performed in the same manner. In a situation in which the second determining unit 14b does not selects WC2 in the example illustrated in FIG. 12D, the number of the worst-case corner candidates being the cover solution is not smaller than two, namely, {WC2, WC3} mentioned above. Therefore, the so-called "pruning" is performed in the same manner.

In the manner described above, the second determining unit 14b performs the process below by handling the worst-case corner candidates that can be handled as the same worst-case corner candidate as a single worst-case corner candidate. That is, the second determining unit 14b determines the worst-case corner candidates that minimize the number of the worst-case corner candidates mapped to the condition sets to be worst-case corners to be used in the simulation. In the example explained above, the second determining unit 14b determines the two worst-case corner candidates {WC2, WC3} that are the cover solution mapped to a plurality of condition sets to be the worst-case corners.

The judging unit 14c simulates the operation of the SRAM circuit, and judges if the SRAM circuit operates normally. For example, the judging unit 14c judges if the SRAM circuit operates normally under all of the condition sets using circuit information of the SRAM circuit, circuit information of writing peripheral circuits for writing information to the SRAM circuit, and the parameters of the worst-case corners determined by the second determining unit 14b.

The judging unit 14c can use a single condition set to make a judgment for a worst-case corner. To explain that with a specific example, when two worst-case corners {WC2, WC3} are determined, the judging unit 14c can make the judgment for WC3 using only one of the condition sets PTV1, PTV3, and PTV4 that are mapped to WC3. In this example, the judging unit 14c will not make the judgment for WC3 using the other two condition sets. This is because the condition sets PTV1, PTV3, and PTV4 are mapped to the worst-case corner WC3, and therefore can be considered to be similar condition sets. In this manner, the judging process performed by the judging unit 14c can be simplified, and the processing speed of the judging process can be increased.

When all of the judging results indicate that the SRAM circuit operates normally, the judging unit 14c transmits an instruction to output a message that conforming SRAM circuits can be produced at the chip yield rate X to the output unit 12. On the contrary, if some of the judging results indicate that the SRAM circuit does not operate normally, the judging unit 14c performs the process below. That is, the judging unit 14c transmits an instruction to output a message that conforming SRAM circuits cannot be produced at the chip yield rate X and to output the parameters of the worst-case corners not allowing the SRAM circuit to operate normally to the output unit 12. In this manner, the parameters of the worst-case corners not allowing the SRAM circuit to operate normally can be output to allow the examiner, for example, to check the parameters.

The control unit 14 is an integrated circuit such as an application specific integrated circuit (ASIC) and a field programmable gate array (FPGA), or an electrical circuit such as a central processing unit (CPU) and a micro processing unit (MPU).

Process Procedure

Figure 13:
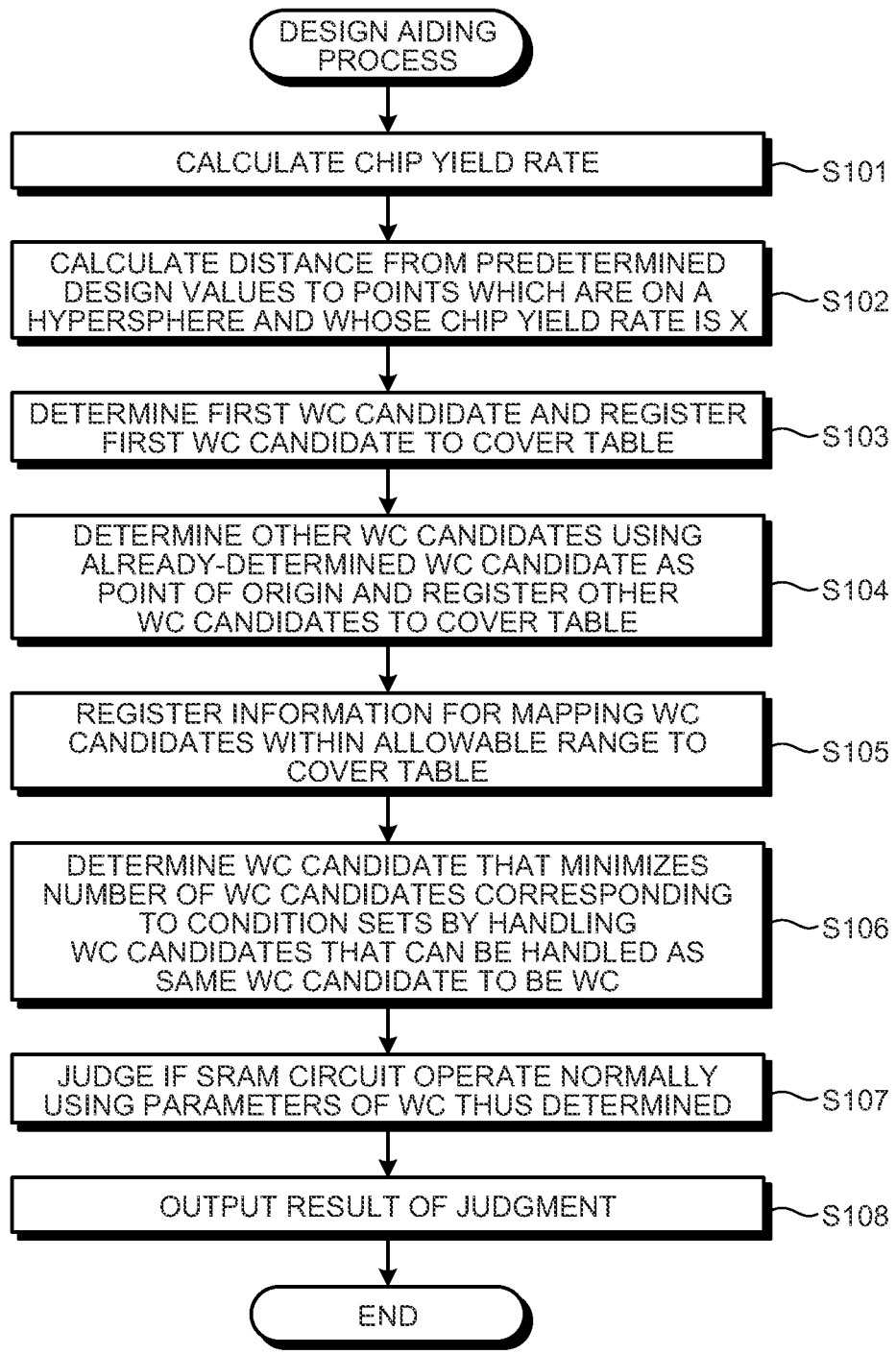
FIG. 13 is a flowchart of a design aiding process according to the first embodiment.

The procedure in the process performed by the design aiding apparatus 10 according to the first embodiment will now be explained. FIG. 13 is a flowchart of the design aiding process according to the first embodiment. The design aiding process is performed when the control unit 14 receives an instruction for executing the design aiding process via the input unit 11.

As illustrated in FIG. 13, the first determining unit 14a calculates the chip yield rate X based on the capacity D and the wafer yield rate Y of the SRAM circuit (Step S101).

The first determining unit 14a calculates the distance r from predetermined design values to points which are on a hypersphere and whose chip yield rate is X (Step S102).

The first determining unit 14a selects one of the PTV condition sets, determines the first worst-case corner candidate, and registers the information indicating that this condition set is mapped to the worst-case corner candidate to the cover table 13b (Step S103).

The first determining unit 14a determines, for each of the remaining PTV condition sets, a corresponding worst-case corner candidate by applying a predetermined gradient method using the worst-case corner candidate having already been determined as a point of origin. The first determining unit 14a also registers the information indicating that each of the condition sets is mapped to the worst-case corner candidate thus determined to the cover table 13b (Step S104).

The first determining unit 14a then registers the information indicating the mapping relationship between the worst-case corner candidates within the allowable margin to the cover table 13b (Step S105). The second determining unit 14b performs the process below by handling the worst-case corner candidates that can be handled as the same worst-case corner candidate as a single worst-case corner candidate. That is, the second determining unit 14b determines the worst-case corner candidates that minimize the number of worst-case corner candidates mapped to the condition sets to be the worst-case corners to be used in the simulation (Step S106).

The judging unit 14c determines if the SRAM circuit operates normally using the circuit information of the SRAM circuit, the circuit information of the writing peripheral circuits for writing information to the SRAM circuit, and the parameters of the worst-case corners determined by the second determining unit 14b (Step S107). If all of the judgment results indicate that the SRAM circuit operates normally, the judging unit 14c transmits an instruction to output a message that conforming SRAM circuits can be produced at the chip yield rate X to the output unit 12. On the contrary, if some of the judging results indicate that SRAM circuit does not operate normally, the judging unit 14c performs the process below. That is, the judging unit 14c transmits an instruction to output a message that conforming SRAM circuits cannot be produced at the chip yield rate X and to output the parameters of the worst-case corners not allowing the SRAM circuit to operate normally to the output unit 12 (Step S108).

Effects Achieved by First Embodiment

As described above, the design aiding apparatus 10 according to the first embodiment determines a worst-case corner candidate for each of a plurality of condition sets based on the condition sets, information of an object being designed, and a chip yield rate. These worst-case corner candidates are on the equal probability plane representing a chip yield rate in a performance index space plotted by parameters that are random variables of a model function for calculating a performance index of the object being designed. Furthermore, the design aiding apparatus 10 according to the first embodiment establishes a mapping relationship between worst-case corner candidates within the same allowable range. Furthermore, the design aiding apparatus 10 according to the first embodiment determines the worst-case corner candidates that minimize the number of worst-case corner candidates mapped to the condition sets by handling the worst-case corner candidates thus mapped as a single worst-case corner candidate to be the worst-case corners. The worst-case corners thus determined are used in simulating the operation of the object being designed under such condition sets. In this manner, the design aiding apparatus 10 according to the first embodiment determines the worst-case corner candidates that minimize the number of worst-case corner candidates mapped to the condition sets to be the worst-case corners to be used in a simulation. Therefore, the design aiding apparatus 10 according to the first embodiment can reduce the number of the worst-case corners to be managed, thereby simplifying the management of the worst-case corners.

Furthermore, once a worst-case corner candidate is determined under one of the condition sets, the design aiding apparatus 10 according to the first embodiment determines the worst-case corner candidates for the other condition sets based on a gradient method using the worst-case corner determined under such a condition set as a point of origin. Therefore, the design aiding apparatus 10 according to the first embodiment can simplify the process and increase the processing speed as well.

Furthermore, when a plurality of condition sets are mapped to a single worst-case corner, the design aiding apparatus 10 according to the first embodiment judges whether the object being designed operates normally under one of such condition sets, using the parameters corresponding to the worst-case corner. Therefore, the design aiding apparatus 10 according to the first embodiment can simplify the judging process and increase the processing speed of the judging process.

Second Embodiment

In the first embodiment, the PTV conditions are specified in values. However, the design aiding apparatus disclosed herein is not limited thereto. In a second embodiment of the present invention, the PTV conditions are explained to be specified in ranges.

Structure of Design Aiding Apparatus 30

Figure 14:
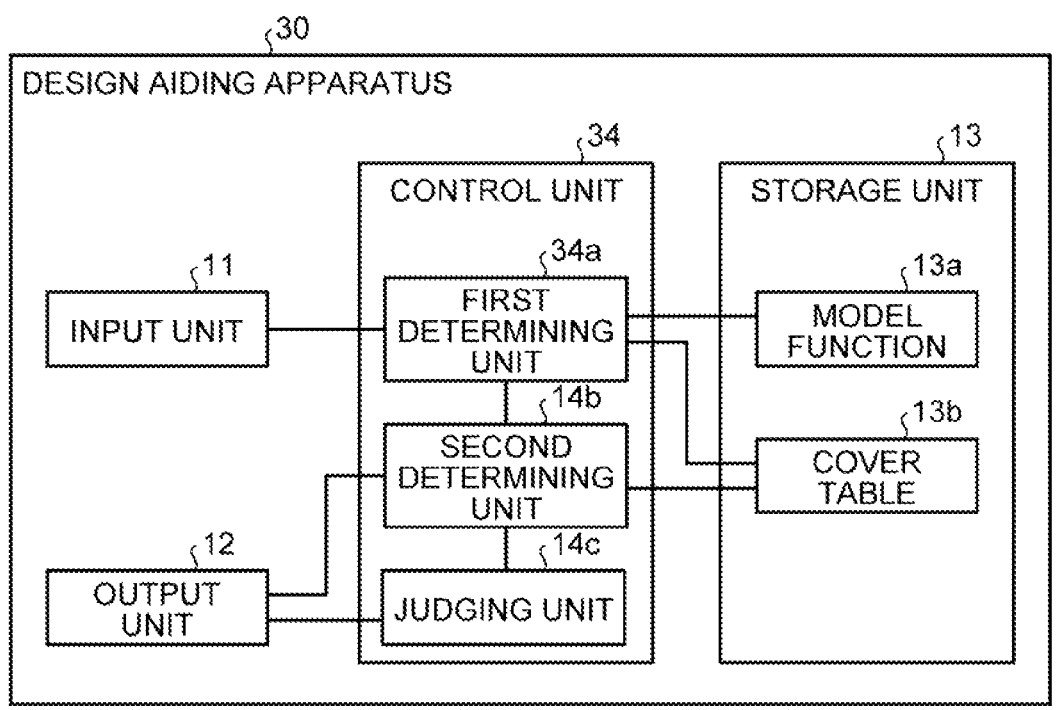
FIG. 14 is a block diagram of a structure of a design aiding apparatus according to a second embodiment of the present invention.

FIG. 14 is a block diagram of a structure of a design aiding apparatus according to the second embodiment. As illustrated in FIG. 14, this design aiding apparatus 30 includes a control unit 34. Compared with the control unit 14 according to the first embodiment illustrated in FIG. 1, the control unit 34 is different in having a first determining unit 34a. The circuits or the devices for achieving the same functions as those according to the first embodiment are given the same reference numerals as those illustrated in FIG. 1, and explanations thereof are omitted herein.

In the second embodiment, the PTV conditions are input to the control unit 34 in ranges via the input unit 11. For example, for the process conditions, $P^p=[P^p_{min}, P^p_{max}]$ and $P^n=[P^n_{min}, P^n_{max}]$ are input as ranges of the PTV conditions via the input unit 11. $P^p$ represents a range of a process condition for the p-channel MOSFETs, such as a range of the threshold voltage. $P^p_{min}$ is the minimum value within the range of the process condition for the p-channel MOSFETs. $P^p_{max}$ is the maximum value within the range of the process condition for the p-channel MOSFETs. $P^n$ represents a range of the process condition for the n-channel MOSFETs, such as a range of the threshold voltage. $P^n_{min}$ is the minimum value within the range of the process condition for the n-channel MOSFETs. $P^n_{max}$ is the maximum value within the range of the process condition for the n-channel MOSFETs.

For the external conditions, $T=[T_{min}, T_{max}]$ and $V=[V_{min}, V_{max}]$ are input as ranges of the PTV conditions via the input unit 11. T represents a range of the temperature. $T_{min}$ is the minimum value within the range of the temperature. $T_{max}$ is the maximum value within the range of the temperature. V represents a range of the voltage. $V_{min}$ is the minimum value within the range of the voltage. $V_{max}$ is the maximum value within the range of the voltage.

The first determining unit 34a selects a PTV condition set from the PTV condition sets specified in such ranges, and determines the worst-case corner candidate using the PTV condition set thus selected. For example, the first determining unit 34a sets the value of a variable to the initial value 1. The first determining unit 34a then divides each one of $P^p=[P^p_{min}, P^p_{max}]$, $P^n=[P^n_{min}, P^n_{max}]$, $T=[T_{min}, T_{max}]$, and $V=[V_{min}, V_{max}]$ into $2^i$ sections. The range represented by $P^p$ is divided into $2^i$ sections: $(P^p_{min}, \ldots, P^p_{max})$. The range represented by $P^n$ is divided into $2^i$ sections: $(P^n_{min}, \ldots, P^n_{max})$. The range represented by T is divided into $2^i$ sections: $(T_{min}, \ldots, T_{max})$. The range represented by V is divided into $2^i$ sections: $(V_{min}, \ldots, V_{max})$.

The first determining unit 34a then repeats selecting a section from the delimiting boundary between the sections in each of the ranges $(P^p_{min}, \ldots, P^p_{max})$, $(P^n_{min}, \ldots, P^n_{max})$, $(T_{min}, \ldots, T_{max})$, and $(V_{min}, \ldots, V_{max})$ so that the selected combinations do not have any redundancy. In this manner, the first determining unit 34a obtains $2^i \times 2^i \times 2^i \times 2^i = 2^{4i}$ sets of PTV conditions $(P^p_{min}, P^n_{min}, T_{min}, V_{min}), \ldots, (P^p_{max}, P^n_{max}, T_{max}, V_{max})$.

The first determining unit 34a then determines the worst-case corner candidates using the $2^{4i}$ sets of PTV conditions following the same process as the process of determining the worst-case corner candidates explained in the first embodiment.

The first determining unit 34a then determines, for each of the $2^{4i}$ PTV condition sets, if the worst-case corner candidate mapped to a set of PTV conditions matches the worst-case corner candidate mapped to the adjacent set of PTV conditions. If the worst-case corner candidate mapped to each one of the PTV condition sets matches the worst-case corner candidate mapped to the PTV condition set adjacent thereto, the first determining unit 34a performs the process below, because the worst-case corner candidates are determined for the entire ranges of the PTV conditions. That is, the first determining unit 34a transmits the worst-case corner candidates thus determined to the second determining unit 14b. The second determining unit 14b then determines the worst-case corners in the same manner as in the first embodiment.

On the contrary, if the worst-case corner candidate corresponding to any one of the PTV condition sets does not match the worst-case corner candidate corresponding to the PTV condition set adjacent thereto, at least partly, the first determining unit 34a increments the value of the variable i by one. The first determining unit 34a then performs the same process described above. In this manner, the range indicated by each of $P^p$, $P^n$, T, and V is further divided into smaller sections. The first determining unit 34a selects a worst-case corner candidate again in the range thus divided into smaller sections, and makes the determination described above.

Process Procedure

Figure 15:
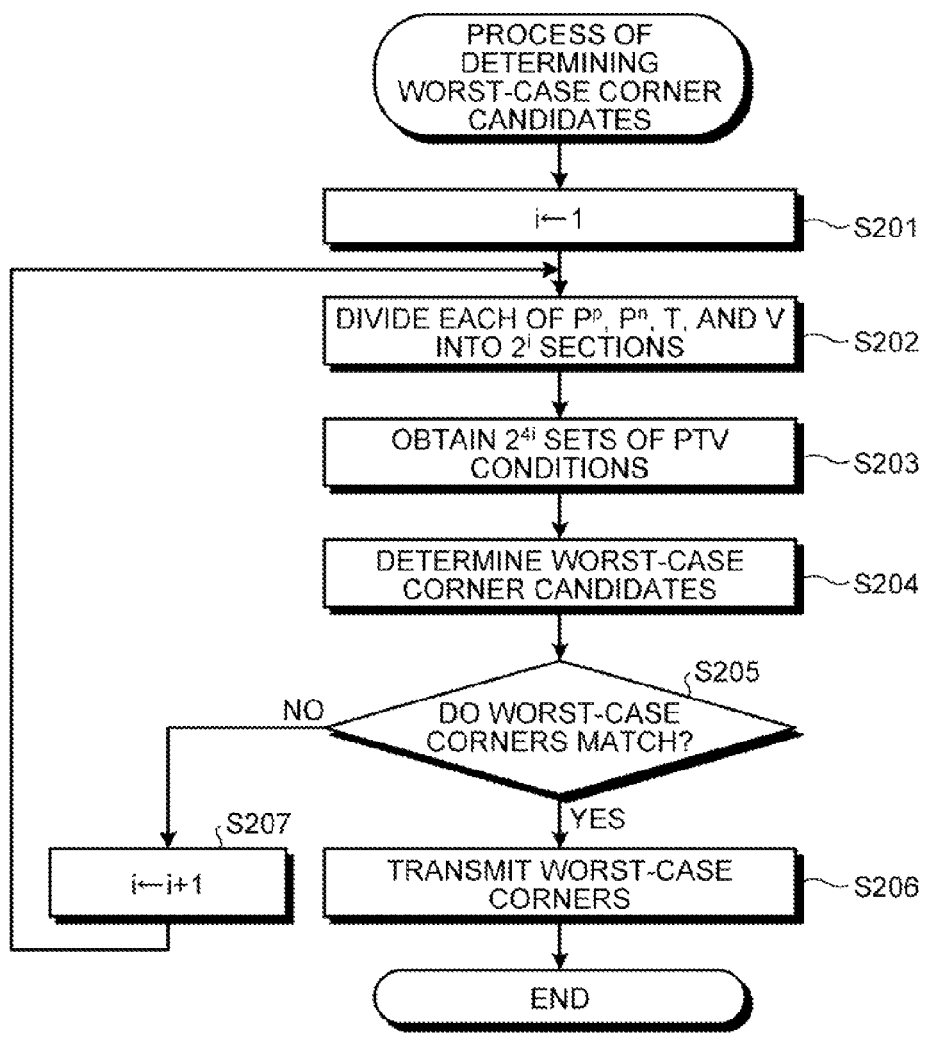
FIG. 15 is a flowchart of a process of determining worst-case corner candidates according to the second embodiment.

The procedure of the process performed by the design aiding apparatus 30 according to the second embodiment will now be explained. FIG. 15 is a flowchart of the process of determining the worst-case corner candidates according to the second embodiment. This process of determining the worst-case corner candidates is executed when an instruction for executing the process of determining the worst-case corner candidates is input to the control unit 34 via the input unit 11.

As illustrated in FIG. 15, the first determining unit 34a sets the value of the variable i to the initial value 1 (Step S201).

The first determining unit 34a divides each of the ranges $P^p=[P^p_{min}, P^p_{max}]$, $P^n=[P^n_{min}, P^N_{max}]$, $T=[T_{min}, T_{max}]$, and $V=[V_{min}, V_{max}]$ into $2^i$ sections (Step S202).

The first determining unit 34a then obtains the $2^{4i}$ sets of PTV conditions $(P^p_{min}, P^n_{min}, T_{min}, V_{min}), \ldots, (P^p_{max}, P^n_{max}, T_{max}, V_{max})$ (Step S203).

The first determining unit 34a then determines the worst-case corner candidates using the $2^{4i}$ sets of PTV conditions in the same manner as explained in the first embodiment (Step S204).

The first determining unit 34a determines if the worst-case corner candidate corresponding to a PTV condition set matches the worst-case corner candidate corresponding to the adjacent PTV condition set, for each of the $2^{4i}$ sets of PTV conditions (Step S205). If the worst-case corner candidate corresponding to each one of the PTV condition sets matches the worst-case corner candidate corresponding to the PTV condition set adjacent thereto (YES at Step S205), the first determining unit 34a performs the process below. That is, the first determining unit 34a transmits the worst-case corner candidates thus determined to the second determining unit 14b (Step S206), and ends the process.

On the contrary, if the worst-case corner candidate corresponding to any PTV condition set does not match the worst-case corner candidate corresponding to the PTV condition set adjacent thereto at least partly (NO at Step S205), the first determining unit 34a performs the process below. That is, the first determining unit 34a increments the value of the variable i by one (Step S207), and returns to Step S202.

Effects Achieved by Second Embodiment

As described above, the design aiding apparatus 30 according to the second embodiment determines a worst-case corner candidate for each of a plurality of condition sets based on the condition sets, information representing an object being designed, and a chip yield rate. These worst-case corner candidates are on the equal probability plane representing a chip yield rate in a performance index space plotted by parameters that are random variables of a model function for calculating a performance index of the object being designed. Furthermore, the design aiding apparatus 30 according to the second embodiment establishes a mapping relationship between the worst-case corner candidates within the same allowable range. Furthermore, the design aiding apparatus 30 according to the second embodiment determines the worst-case corner candidates that minimize the number of worst-case corner candidates mapped to the condition sets by handling the worst-case corner candidates thus mapped as a single worst-case corner candidate to be the worst-case corners. The worst-case corners thus determined are used in simulating the operation of the object being designed under the condition sets. In this manner, the design aiding apparatus 30 according to the second embodiment determines the worst-case corner candidates that minimize the number of worst-case corner candidates mapped to the condition sets to be the worst-case corners to be used in a simulation. Therefore, the design aiding apparatus 30 according to the second embodiment can reduce the number of the worst-case corners to be managed, thereby simplifying the management of the worst-case corners.

Furthermore, once a worst-case corner candidate is determined under one of the condition sets, the design aiding apparatus 30 according to the second embodiment determines the worst-case corner candidates for the other condition sets based on a gradient method using the worst-case corner determined under such a condition set as a point of origin. Therefore, the design aiding apparatus 30 according to the second embodiment can simplify the process and increase the processing speed as well.

Furthermore, when each of the condition sets is specified in a range, the design aiding apparatus 30 according to the second embodiment performs the process below based on conditions within the range thus specified in each of the conditions. That is, the design aiding apparatus 30 according to the second embodiment determines worst-case corner candidates, and establishes a mapping relationship between the worst-case corner candidates that are within an allowable range. The design aiding apparatus 30 according to the second embodiment then determines the worst-case corner candidates that minimize the number of worst-case corner candidates mapped to the condition sets by handling the worst-case corner candidates thus mapped as a single worst-case corner candidate to be the worst-case corners. Therefore, the design aiding apparatus 30 according to the second embodiment can determine a worst-case corner covering the input range of conditions.

Furthermore, when a plurality of condition sets are mapped to a single worst-case corner, the design aiding apparatus 30 according to the second embodiment judges whether the object being designed operates normally under one of such condition sets using the parameters corresponding to the worst-case corner. Therefore, the design aiding apparatus 30 according to the second embodiment can simplify the judging process, and the processing speed of the judging process can be increased.

Third Embodiment

In a third embodiment of the present invention, a regression equation model for determining worst-case corner candidates are generated from the PTV conditions, and the worst-case corner candidates are determined using the regression equation model thus generated.

Structure of Design Aiding Apparatus 50

Figure 16:
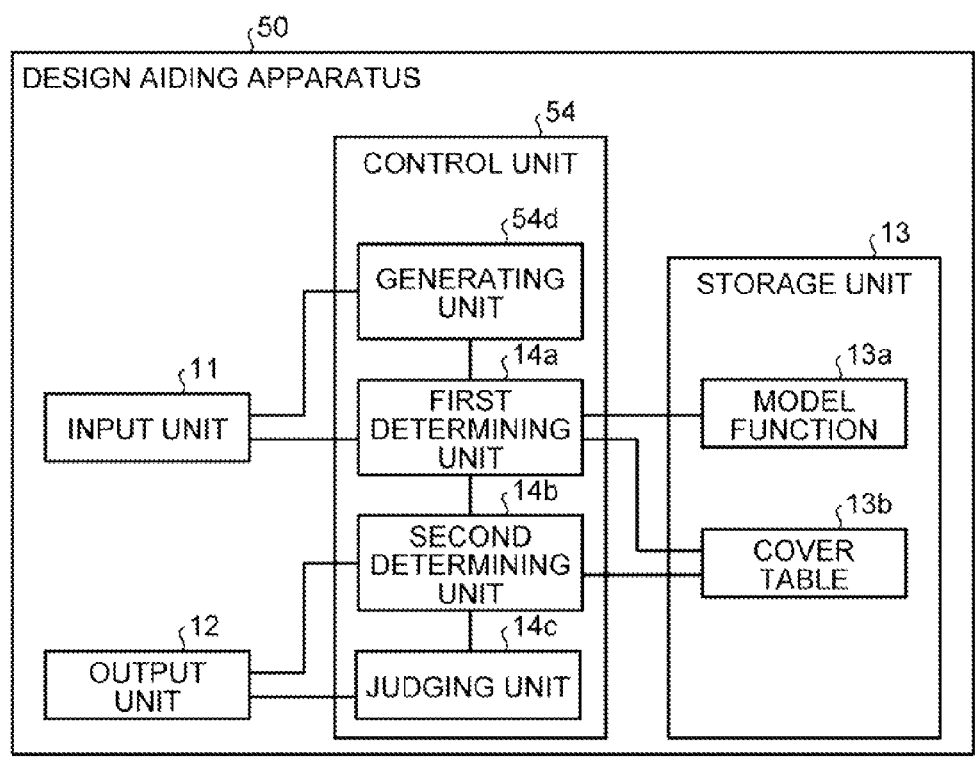
FIG. 16 is a block diagram of a structure of a design aiding apparatus according to a third embodiment of the present invention.

FIG. 16 is a block diagram of a structure of a design aiding apparatus according to the third embodiment. As illustrated in FIG. 16, this design aiding apparatus 50 includes a control unit 54. Compared with the control unit 14 according to the first embodiment illustrated in FIG. 1, the control unit 54 is different in having a generating unit 54d. The circuits or the devices for achieving the same functions as those according to the first embodiment are given the same reference numerals as those illustrated in FIG. 1, and explanations thereof are omitted herein.

In the third embodiment, each of the PTV conditions is input to the control unit 54 in a range via the input unit 11 in the same manner as in the second embodiment.

The generating unit 54d selects six points (six sets) or more from the respective input ranges of the PTV conditions. For example, the generating unit 54d selects $p_p$, $p_n$, t, and v from the ranges $P^p=[P^p{}_{min}, P^p{}_{max}]$, $P^n=[P^n{}_{min}, P^n{}_{max}]$, $[T_{min}, T_{max}]$, and $V=[V_{min}, V_{max}]$ respectively. The generating unit 54d then generates six or more combinations of the selected conditions so as not to have any redundancy. The generating unit 54d then inputs the six or more PTV condition sets to the first determining unit 14a, and obtains six or more worst-case corner candidates determined by the first determining unit 14a.

The generating unit 54d then uses the six or more worst-case corner candidates thus obtained and the PTV condition set corresponding to each of the worst-case corner candidates to determine the coefficients k1, k2, k3, k4, and k5 included in the following equation (3) using a linear regression analysis so as to generate the regression equation model expressed in the equation (3).

$$f(P^p, P^n, T, V) = k1 \times p_p + k2 \times p_n + k3 \times t + k4 \times v + k5 \qquad (3)$$

where $f(P^p, P^n, T, V)$ represents the worst-case corner candidates.

The generating unit 54d then determines the worst-case corner candidates by applying the PTV condition set ($p_p$, $p_n$, t, v) whose mapping relationship with the worst-case corner candidate is known with respect to the regression equation model. The generating unit 54d then compares the worst-case corner candidates thus determined with the worst-case corner candidate whose mapping relationship is known, thereby determining if the difference therebetween is within a predetermined allowable margin. If the difference is within the predetermined allowable margin, the first determining unit 14a determines the worst-case corner candidates based on the PTV condition sets using the regression equation model indicated in the equation (3).

If the difference is greater than the predetermined allowable margin, the generating unit 54d divides each of the ranges $P^p=[P^p{}_{min}, P^p{}_{max}]$, $P^n=[P^n{}_{min}, P^n{}_{max}]$, $T=[T_{min}, T_{max}]$, and $V=[V_{min}, V_{max}]$. The generating unit 54d then selects a plurality of PTV conditions from the divided ranges, in the same manner as explained above. The generating unit 54d then inputs the PTV conditions thus selected to the first determining unit 14a in the same manner as described above, and obtains the worst-case corner candidates determined by the first determining unit 14a. The generating unit 54d then performs the subsequent processes in the same manner as that explained above. An analysis using a nonlinear, second-degree or higher model formula may also be applied to the linear regression analysis. In such a case, the number of points selected from the range of the PTV conditions are set to [the number of coefficients in the model formula+1] or larger so that the equation is uniquely identified.

Process Procedure

Figure 17:
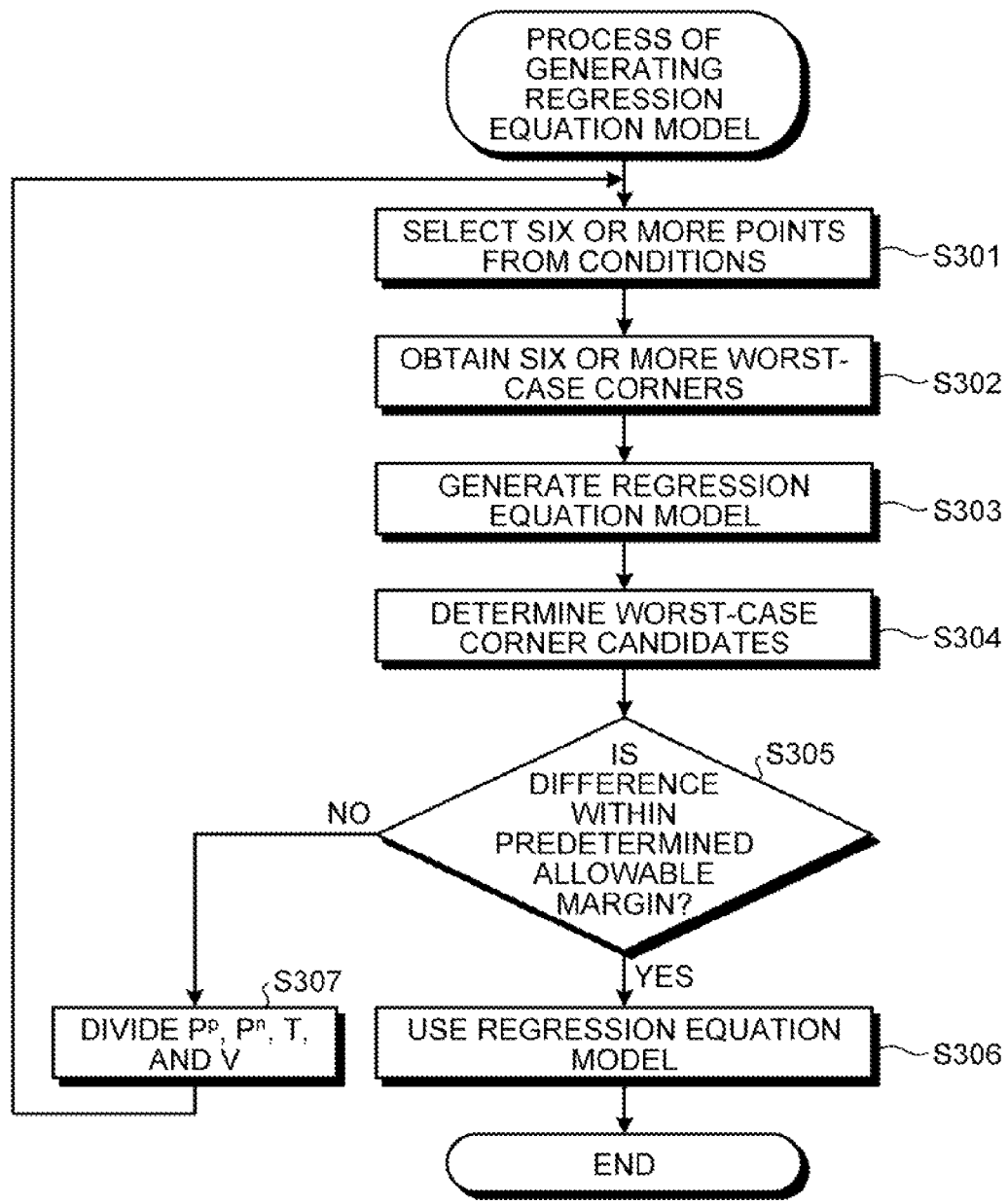
FIG. 17 is a flowchart of a process of generating a regression equation model according to the third embodiment.

The procedure of the process performed by the design aiding apparatus 50 according to the third embodiment will now be explained. FIG. 17 is a flowchart of the process of generating the regression equation model according to the third embodiment. This process of generating the regression equation model is executed when an instruction for generating the regression equation model is input to the control unit 54 via the input unit 11.

As illustrated in FIG. 17, the generating unit 54d selects six or more points from the ranges of the PTV conditions (Step S301).

The generating unit 54d then inputs the six or more PTV condition sets to the first determining unit 14a, and obtains six or more worst-case corner candidates determined by the first determining unit 14a (Step S302).

The generating unit 54d determines the coefficients k1, k2, k3, k4, and k5 mentioned above by applying the linear regression analysis using the six or more worst-case corner candidates thus obtained and the PTV condition set corresponding to each of the worst-case corner candidates, and generates a regression equation model (Step S303).

The generating unit 54d then applies a PTV condition set ($p_p$, $p_n$, t, v) whose mapping relationship with a worst-case corner candidate is known with respect to the regression equation model thus generated to determine the worst-case corner candidates (Step S304).

The generating unit 54d then compares the worst-case corner candidates thus determined with the worst-case corner candidate whose mapping relationships is already known, and determines if the difference therebetween is within a predetermined allowable margin (Step S305). If the difference is within the predetermined allowable margin (YES at Step S305), the first determining unit 14a determines the worst-case corner candidates based on the PTV condition sets using the regression equation model (Step S306), and the process is ended.

On the contrary, if the difference is greater than the allowable margin (NO at Step S305), the generating unit 54d divides the range of each of the PP, $P^n$, T, and V (Step S307), returns to Step S301, and selects six or more conditions from the divided ranges of the PTV conditions.

Effects Achieved by Third Embodiment

As described above, the design aiding apparatus 50 according to the third embodiment determines worst-case corner candidates for each of a plurality of condition sets based on the condition sets. Furthermore, the design aiding apparatus 50 according to the third embodiment establishes a mapping relationship between the worst-case corner candidates that are within an allowable range. Furthermore, the design aiding apparatus 50 according to the third embodiment determines the worst-case corner candidates that minimize the number of worst-case corner candidates mapped to the condition sets by handling the worst-case corner candidates thus mapped as a single worst-case corner candidate to be the worst-case corners. In this manner, the design aiding apparatus 50 according to the third embodiment determines the worst-case corner candidates that minimize the number of worst-case corner candidates mapped to a plurality of condition sets to be the worst-case corners to be used in a simulation.

Therefore, the design aiding apparatus 50 according to the third embodiment can reduce the number of worst-case corners to be managed, thereby simplifying the management of the worst-case corners.

Furthermore, the design aiding apparatus 50 according to the third embodiment generates a regression equation model for determining the worst-case corner candidates from the PTV condition sets based on the PTV condition sets and worst-case corner candidate corresponding thereto. The design aiding apparatus 50 according to the third embodiment then uses the regression equation model thus generated to determine the worst-case corner candidates from the PTV condition sets. Therefore, the design aiding apparatus 50 according to the third embodiment can determine worst-case corner candidates in a simple manner.

Although the embodiments of the design aiding apparatus disclosed herein are explained so far, the present invention may also be realized in various different embodiments other than those described above. Therefore, other embodiments within the scope of the present invention will now be explained.

Dividing Condition Ranges

In the example explained in the third embodiment, the generating unit 54d divides each of the ranges of $P^p$, $P^n$, T, and V when the difference is greater than the predetermined allowable margin. However, the present invention disclosed herein is not limited thereto. For example, the design aiding apparatus disclosed herein can divide at least one of the ranges of $P^p$, $P^n$, T, and V as long as a predetermined precision is ensured. Furthermore, any one of the respective ranges of $P^p$, $P^n$, T, and V may be divided as used in the second embodiment as well as long as a predetermined precision is ensured.

Allowable Margin

Figure 18:
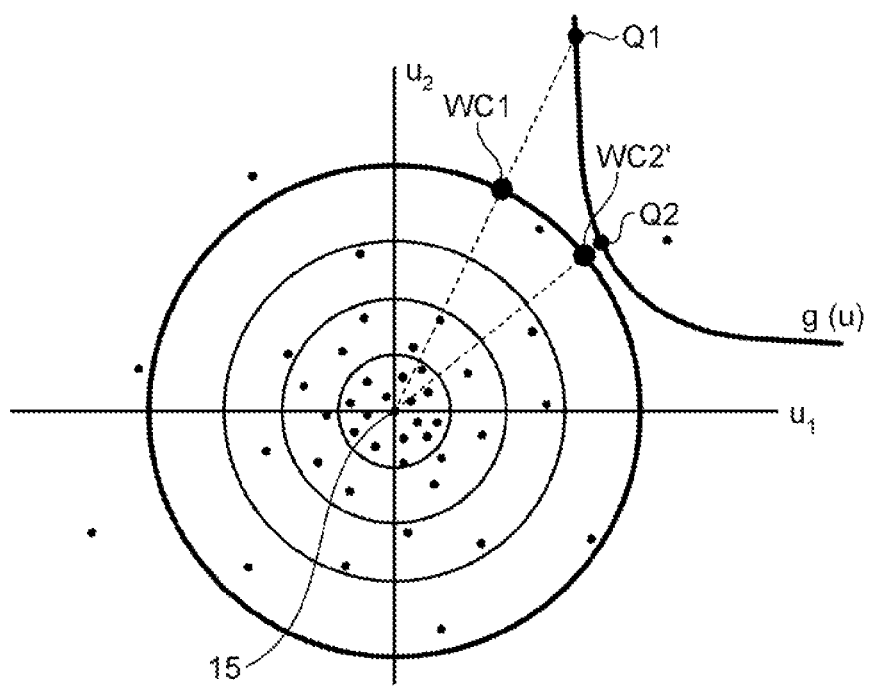
FIG. 18 is a schematic of an example where a chip yield rate is used as an allowable margin.

In the first embodiment, an angle corresponding to a predetermined scale of the performance index is used as an allowable margin. However, the design aiding apparatus disclosed herein is not limited thereto. For example, for the design aiding apparatus disclosed herein, a chip yield rate corresponding to a predetermined scale of the performance index may be used as an allowable margin. FIG. 18 is a schematic of an example where a chip yield rate is used as an allowable margin. As illustrated in FIG. 18, the first determining unit 14a calculates a chip yield rate corresponding to an intersection Q1 between the line originating at the design value 15 and extending in the direction toward the worst-case corner candidate WC1 that has been determined first and a defect boundary g(u). The first determining unit 14a also calculates a chip yield rate corresponding to an intersection Q2 between the line originating at the design value 15 and extending in the direction toward the worst-case corner candidate WC2' and the defect boundary g(u). If the difference between the chip yield rate corresponding to Q1 and the chip yield rate corresponding to Q2 thus calculated is within a predetermined allowable margin, the first determining unit 14a determines that WC1 and WC2' are within the allowable margin.

Scope

In each of the embodiments described above, a circuit is used as an example of an object being designed. However, the design aiding apparatus disclosed herein is not limited thereto. For example, the design aiding apparatus may be used for designing a building, for example. In other words, objects being designed may be any objects as long as parameters of a model function for calculating the performance index can be handled as random variables. Furthermore, the design apparatus are applicable to any objects whose performance changes depending on a plurality of variation factors, and the variation of each of such factors can be defined by a probability distribution.

Furthermore, among the processes explained in the respective embodiments, the whole or a part of the processes explained to be executed automatically may also be executed manually. Furthermore, the whole or a part of the processes explained in the embodiment to be performed manually may be performed automatically by known methods. For example, an examiner may divide or separate the ranges of conditions at Step S202 in FIG. 15 or Step S307 in FIG. 17.

Furthermore, the process performed at each of the steps included in each of the processes explained in the respective embodiments may be divided into smaller processes or grouped into a larger process depending on various types of load and utilization conditions.

Furthermore, some of the steps may be omitted. For example, for calculating the chip yield rate X may be omitted.

Furthermore, each of the units included in each of the design aiding apparatuses illustrated in the drawings is functional and conceptual, and does not have to be configured physically in the manner as illustrated. In other words, specific forms of distribution and integration of these units are not limited to those illustrated in the drawings, and the whole or a part thereof may be functionally or physically distributed to or integrated into any units depending on various types of load and utilization conditions. For example, the first determining unit 14a and the second determining unit 14b illustrated in FIG. 1 may be integrated into a single unit.

Design Aiding Program

Figure 19:
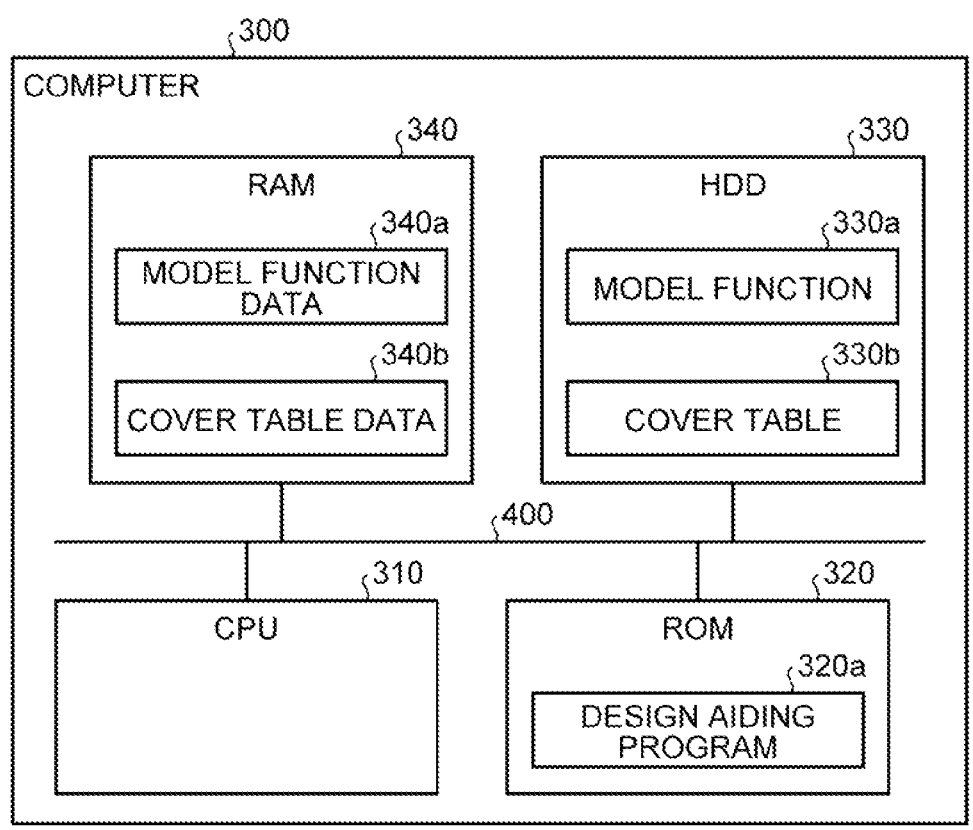
FIG. 19 is a schematic of a computer executing a design aiding program.

Furthermore, various processes performed by the moving object identifying apparatus explained in the embodiments may be realized by causing a computer system, such as a personal computer and a work station, thereby executing a computer program formulated in advance. Therefore, an example of a computer executing a design aiding program having functions that are equivalent to those included in the design aiding apparatus described in the embodiments will be explained below with reference to the FIG. 19. FIG. 19 is a schematic of a computer executing the design aiding program.

As illustrated in FIG. 19, this computer 300 according to a fourth embodiment of the present invention includes a central processing unit (CPU) 310, a read-only memory (ROM) 320, a hard disk drive (HDD) 330, and a random access memory (RAM) 340. These components 300 to 340 are connected to each other connected via a bus 400.

A design aiding program achieving the same functions as those as the first determining unit 14a, the second determining unit 14b, and the judging unit 14c in the first embodiments is stored in the ROM 320 in advance. In other words, as illustrated in FIG. 19, a design aiding program 320a is stored in the ROM 320 in advance. The design aiding program 320a may be divided.

The CPU 310 reads the design aiding program 320a from the ROM 320 and executes the design aiding program 320a.

A model function 330a and a cover table 330b are established in the HDD 330. The model function 330a and the cover table 330b correspond to the model function 13a and the cover table 13b, respectively, illustrated in FIG. 1.

The CPU 310 reads the model function 330a and the cover table 330b, and stores the model function 330a and the cover table 330b in the RAM 340. The CPU 310 executes the design aiding program 320a using model function data 340a and cover table data 340b stored in the RAM 340. All of the data stored in the RAM 340 does not always have to be stored in the RAM 340, and only data currently used in a process may be stored in the RAM 340.

The design aiding program does not necessarily have to be stored in the HDD 330 from the beginning.

For example, the design aiding program may be stored in a "portable physical medium" inserted into the computer 300, such as a flexible disk (FD), a compact disk read-only memory (CD-ROM), a digital versatile disk (DVD), an magneto-optical disk, and an integrated circuit (IC) card. The computer 300 may read the design aiding program from such a medium and execute the design aiding program.

Furthermore, the design aiding program may be stored in "another computer (or a server)" connected to the computer 300 over a public circuit, the Internet, a local area network (LAN), or a wide area network (WAN), so that the computer 300 can read the design aiding program therefrom and execute the design aiding program.

One aspect of a design aiding apparatus disclosed herein enables worst-case corners to be managed more easily.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A computer readable non-transitory medium storing a design aiding program causing a computer to execute:

mapping, among a plurality of worst-case corner candidates, a first worst-case corner candidate and a second worst-case corner candidate, an angle made by a first line which connects a point corresponding to the first worst-case corner candidate with a predetermined point and a second line which connects a point corresponding to the second worst-case corner candidate with the predetermined point being within a predetermined allowable range, after calculating, for each one of a plurality of condition sets, worst-case corner candidates on an equal probability plane representing a chip yield rate calculated from a capacity and a wafer yield rate of a SRAM circuit or a predetermined chip yield rate within a space of performance indices plotted by parameters that are random variables of a model function for calculating a performance index of an simulation model based on the condition sets, simulation model information representing the simulation model, and the chip yield rate; and determining a worst-case corner candidate that minimizes number of worst-case corner candidates mapped to the condition sets by handling the worst-case corner candidates thus mapped as a single worst-case corner candidate to be worst-case corners used in simulating an operation of the simulation model under the condition sets.

2. The computer readable non-transitory medium storing the design aiding program according to claim 1, wherein the mapping includes, when a worst-case corner candidate for one of the condition sets is calculated, calculatinq worst-case corner candidates for another condition set based on a gradient method using the worst-case corner candidate calculated under the one condition set as a point of origin.

3. The computer readable non-transitory medium storing the design aiding program according to claim 1, wherein the mapping includes, when ranges of conditions are specified in each one of the condition sets, calculatinq the worst-case corner candidates based on the conditions within the respective ranges of the conditions and mapping the worst-case corner candidates that are within the allowable range.

4. The computer readable non-transitory medium storing the design aiding program according to claim 2, wherein the mapping includes, when ranges of conditions are specified in each one of the condition sets, calculating the worst-case corner candidates based on the conditions within the respective ranges of the conditions and mapping the worst-case corner candidates that are within the allowable range.

5. The computer readable non-transitory medium storing the design aiding program according to claim 1 causing the computer to further execute:

judging whether the simulation model operates normally using the parameters corresponding to each of the worst-case corners thus determined; and when a plurality of condition sets are mapped to one worst-case corner, judging whether the simulation model operates normally using the parameters corresponding to the one worst-case corner under one of the condition sets.

6. The computer readable non-transitory medium storing the design aiding program according to claim 2 causing the computer to further execute:

judging whether the simulation model operates normally using the parameters corresponding to each of the worst-case corners thus determined; and when a plurality of condition sets are mapped to one worst-case corner, judging whether the simulation model operates normally using the parameters corresponding to the one worst-case corner under one of the condition sets.

7. The computer readable non-transitory medium storing the design aiding program according to claim 3 causing the computer to further execute:
judging whether the simulation model operates normally using the parameters corresponding to each of the worst-case corners thus determined; and
when a plurality of condition sets are mapped to one worst-case corner, judging whether the simulation model operates normally using the parameters corresponding to the one worst-case corner under one of the condition sets.

8. The computer readable non-transitory medium storing the design aiding program according to claim 4 causing the computer to further execute:
judging whether the simulation model operates normally using the parameters corresponding to each of the worst-case corners thus determined; and
when a plurality of condition sets are mapped to one worst-case corner, judging whether the simulation model operates normally using the parameters corresponding to the one worst-case corner under one of the condition sets.

9. The computer readable non-transitory medium storing the design aiding program according to claim 1 causing the computer to further execute:
generating a regression equation model for calculating worst-case corner candidates based on a plurality of condition sets and a plurality of worst-case corner candidates corresponding to the respective condition sets, wherein
the mapping includes calculating the worst-case corner candidates using the regression equation model.

10. The computer readable non-transitory medium storing the design aiding program according to claim 2 causing the computer to further execute:
generating a regression equation model for calculating worst-case corner candidates based on a plurality of condition sets and a plurality of worst-case corner candidates corresponding to the respective condition sets, wherein
the mapping includes calculating the worst-case corner candidates using the regression equation model.

11. The computer readable non-transitory medium storing the design aiding program according to claim 3 causing the computer to further execute:
generating a regression equation model for calculating worst-case corner candidates based on a plurality of condition sets and a plurality of worst-case corner candidates corresponding to the respective condition sets, wherein
the mapping includes calculatinq the worst-case corner candidates using the regression equation model.

12. The computer readable non-transitory medium storing the design aiding program according to claim 4 causing the computer to further execute:
generating a regression equation model for calculatinq worst-case corner candidates based on a plurality of condition sets and a plurality of worst-case corner candidates corresponding to the respective condition sets, wherein
the mapping includes calculatinq the worst-case corner candidates using the regression equation model.

13. The computer readable non-transitory medium storing the design aiding program according to claim 5 causing the computer to further execute:
generating a regression equation model for calculatinq worst-case corner candidates based on a plurality of condition sets and a plurality of worst-case corner candidates corresponding to the respective condition sets, wherein
the mapping includes calculatinq the worst-case corner candidates using the regression equation model.

14. The computer readable non-transitory medium storing the design aiding program according to claim 6 causing the computer to further execute:
generating a regression equation model for calculating worst-case corner candidates based on a plurality of condition sets and a plurality of worst-case corner candidates corresponding to the respective condition sets, wherein
the mapping includes calculating the worst-case corner candidates using the regression equation model.

15. The computer readable non-transitory medium storing the design aiding program according to claim 7 causing the computer to further execute:
generating a regression equation model for calculating worst-case corner candidates based on a plurality of condition sets and a plurality of worst-case corner candidates corresponding to the respective condition sets, wherein
the mapping includes calculatinq the worst-case corner candidates using the regression equation model.

16. The computer readable non-transitory medium storing the design aiding program according to claim 8 causing the computer to further execute:
generating a regression equation model for calculatinq worst-case corner candidates based on a plurality of condition sets and a plurality of worst-case corner candidates corresponding to the respective condition sets, wherein
the mapping includes calculatinq the worst-case corner candidates using the regression equation model.

17. A design aiding apparatus comprising:
a first determining unit that maps, among a plurality of worst-case corner candidates a first worst-case corner candidate and a second worst-case corner candidate, an angle made by a first line which connects a point corresponding to the first worst-case corner candidate with a predetermined point and a second line which connects a point corresponding to the second worst-case corner candidate with the predetermined point being within a predetermined allowable range, after calculating worst-case corner candidates for each one of a plurality of condition sets on an equal probability plane representing a chip yield rate calculated from a capacity and a wafer yield rate of a SRAM circuit or a predetermined chip yield rate within a space of performance indices plotted by parameters that are random variables of a model function for calculating a performance index of an simulation model based on the condition sets, simulation model information representing the simulation model, and the chip yield rate; and
a second determining unit that determines the worst-case corner candidates that minimize number of worst-case corner candidates mapped to the condition sets by handling the worst-case corner candidates mapped by the first determining unit as a single worst-case corner candidate to be worst-case corners used in simulating an operation of the simulation model under the condition sets.

18. A design aiding method executed by a computer, the method comprising:
mapping, among a plurality of worst-case corner candidates, a first worst-case corner candidate and a second worst-case corner candidate, an angle made by a first line which connects a point corresponding to the first worst-case corner candidate with a predetermined point and a second line which connects a point corresponding to the second worst-case corner candidate with the predetermined point being within a predetermined allowable range, after calculating worst-case corner candidates for each one of a plurality of condition sets on an equal probability plane representing a chip yield rate calculated from a capacity and a wafer yield rate of a SRAM circuit or a predetermined chip yield rate within a space of performance indices plotted by parameters that are random variables of a model function for calculating a performance index of an simulation model based on the condition sets, simulation model information representing the simulation model, and the chip yield rate; and determining the worst-case corner candidates that minimize number of worst-case corner candidates mapped to the condition sets by handling the worst-case corner candidates thus mapped as a single worst-case corner candidate to be worst-case corners used in simulating an operation of the simulation model under the condition sets.

* * * * *